United States Patent
Sokolov et al.

(10) Patent No.: US 11,367,835 B2
(45) Date of Patent: Jun. 21, 2022

(54) QUANTUM DOT LIGHT EMITTING DEVICES

(71) Applicants: DOW GLOBAL TECHNOLOGIES LLC, Midland, MI (US); ROHM AND HAAS ELECTRONIC MATERIALS LLC, Marlborough, MA (US)

(72) Inventors: Anatoliy N. Sokolov, Midland, MI (US); Brian Goodfellow, Midland, MI (US); Robert David Grigg, Midland, MI (US); Liam P. Spencer, Lake Jackson, TX (US); John W. Kramer, Midland, MI (US); David D. Devore, Midland, MI (US); Sukrit Mukhopadhyay, Midland, MI (US); Peter Trefonas, III, Marlborough, MA (US)

(73) Assignees: Dow Global Technologies LLC, Midland, MI (US); Rohm and Haas Electronic Materials LLC, Marlboroug, MA (US)

( * ) Notice: Subject to any disclaimer, the term of this patent is extended or adjusted under 35 U.S.C. 154(b) by 374 days.

(21) Appl. No.: 16/344,406

(22) PCT Filed: Jun. 26, 2017

(86) PCT No.: PCT/US2017/039188
§ 371 (c)(1),
(2) Date: Apr. 24, 2019

(87) PCT Pub. No.: WO2018/084899
PCT Pub. Date: May 11, 2018

(65) Prior Publication Data
US 2020/0052218 A1 Feb. 13, 2020

Related U.S. Application Data

(60) Provisional application No. 62/417,539, filed on Nov. 4, 2016, provisional application No. 62/417,533, filed on Nov. 4, 2016.

(51) Int. Cl.
*H01L 51/50* (2006.01)
*H01L 51/00* (2006.01)

(52) U.S. Cl.
CPC ...... *H01L 51/0059* (2013.01); *H01L 51/0034* (2013.01); *H01L 51/0081* (2013.01); *H01L 51/0082* (2013.01); *H01L 51/5092* (2013.01); *H01L 51/5096* (2013.01)

(58) Field of Classification Search
None
See application file for complete search history.

(56) References Cited

U.S. PATENT DOCUMENTS

| 9,978,473 B2 | 5/2018 | Seshadri et al. |
| 2005/0142379 A1* | 6/2005 | Juni .................... H01L 51/5275 428/690 |
| 2012/0181530 A1 | 7/2012 | Funyuu et al. |

FOREIGN PATENT DOCUMENTS

GB 2516930 A 2/2015

OTHER PUBLICATIONS

Ho et al., Polymer and Small Molecule Mixture for Organic Hole Transport Layers in Quantum Dot Light-Emitting Diodes, ACS Applied Materials & Interfaces 2013, 5, 12369-12374 (Year: 2013).*
Michinobu et al., Two-Dimensionally Extended Aromatic Polyamines for Optimization of Charge-Transporting Properties by Partial Oxidation, 2009, Journal of Polymer Science: Part A: Polymer Chemistry, vol. 47, n.. 18, pp. 4577-4586 (Year: 2009).*
My Duyen Ho et al: "Polymer and Small Molecule Mixture for Organic Hole Transport Layers in Quantum Dot Light-Emitting Diodes", ACS Appl. Mater.Interfaces, vol. 5, No. 23, Dec. 11, 2013, pp. 12369-12374.
Tsuyoshi Michinobu et al: "Two-dimensionally extended aromatic polyamines for optimization of charge-transporting properties by partial oxidation", Journal of Polymer Science, Part A: Polymer Chemistry, vol. 47, No. 18, Sep. 15, 2009, pp. 4577-4586.
Search Report for Chinese Patent Application No. 201780064920.1; dated Jun. 26, 2017.

* cited by examiner

*Primary Examiner* — Gregory D Clark
(74) *Attorney, Agent, or Firm* — G. Creston Campbell

(57) ABSTRACT

The present invention provides a quantum dot light emitting diode comprising i) an emitting layer of at least one semiconductor nanoparticle made from semiconductor materials selected from the group consisting of Group II-VI compounds, Group II-V compounds, Group III-VI compounds, Group III-V compounds, Group IV-VI compounds, Group I-III-VI compounds, Group II-IV-VI compounds, Group II-IV-V compounds, or any combination thereof; and ii) a polymer for hole injection or hole transport layer, comprising one or more triaryl aminium radical cations having the structure (S1).

10 Claims, No Drawings

QUANTUM DOT LIGHT EMITTING DEVICES

FIELD OF THE DISCLOSURE

The present disclosure relates to an electronic device, especially, a quantum dot light emitting diode.

INTRODUCTION

Quantum dot light emitting diodes (QLEDs) are electroluminescent devices that employ multiple organic and inorganic layers in combination with an emissive layer of semiconductor nanoparticle, sometimes referred to as quantum dots (QDs). The quantum dot layer in the QLED is capable of emitting light when an electrical input is applied to the device. Consequently, QLEDs can be used as light sources in display and general lighting applications. One limitation of QLEDs is the lack of suitable hole-transport layers (HTLs) capable of efficient charge injection into the quantum dot layers. Poor charge injection into the quantum dot results in QLED devices with high operating voltages and low light generation efficiency.

Therefore, there is a continuing desire for new hole-transport materials to enable improved QLED devices with high brightness and color purity, minimized power consumption, and high reliability.

SUMMARY OF THE DISCLOSURE

The present invention provides a quantum dot light emitting diode comprising i) an emitting layer of at least one semiconductor nanoparticle made from semiconductor materials selected from the group consisting of Group II-VI compounds, Group II-V compounds, Group III-VI compounds, Group III-V compounds, Group IV-VI compounds, Group I-III-VI compounds, Group II-IV-VI compounds, Group II-IV-V compounds, or any combination thereof; and ii) a polymer for hole injection or hole transport layer, comprising one or more triaryl aminium radical cations having the structure (S1)

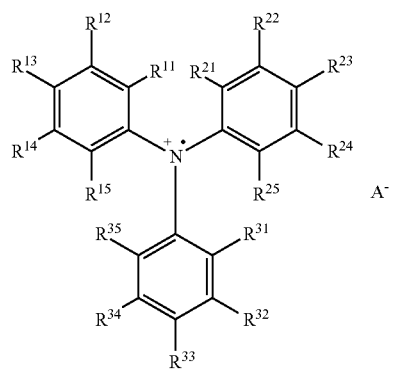

(S1)

with each of $R^{11}$, $R^{12}$, $R^{13}$, $R^{14}$, $R^{15}$, $R^{21}$, $R^{22}$, $R^{23}$, $R^{24}$, $R^{25}$, $R^{31}$, $R^{32}$, $R^{33}$, $R^{34}$, and $R^{35}$ being independently selected from the group consisting of hydrogen, deuterium, halogens, amine groups, hydroxyl groups, sulfonate groups, nitro groups, and organic groups; and two or more of $R^{11}$, $R^{12}$, $R^{13}$, $R^{14}$, $R^{15}$, $R^{21}$, $R^{22}$, $R^{23}$, $R^{24}$, $R^{25}$, $R^{31}$, $R^{32}$, $R^{33}$, $R^{34}$, and $R^{35}$ being optionally connected to each other to form a ring structure; and one or more of $R^{11}$, $R^{12}$, $R^{13}$, $R^{14}$, $R^{15}$, $R^{21}$, $R^{22}$, $R^{23}$, $R^{24}$, $R^{25}$, $R^{31}$, $R^{32}$, $R^{33}$, $R^{34}$, and $R^{35}$ being covalently bound to the polymer; and $A^-$ is an anion.

DETAILED DESCRIPTION OF THE DISCLOSURE

The quantum dot light emitting device of the present invention comprises an anode layer, optionally one or more hole injection layers, one or more hole transport layers, optionally one or more electron blocking layers, an emitting layer, optionally one or more hole blocking layers, optionally one or more electron transport layers, optionally one or an more electron injection layers, and a cathode.

The light emissive layer comprises at least one semiconductor nanoparticle.

Either the hole injection layer, or the hole transport layer, or both of the hole injection layer and the hole transport layer, or a layer that functions as either/both a hole injection layer or/and a hole transport layer, comprise(s) a polymer of the following descriptions.

Light Emissive Layer

The light emissive layer of the QLED comprises semiconductor nanoparticles. In some embodiments, the semiconductor nanoparticle may comprise an elemental, binary, ternary, or quaternary semiconductor. The semiconductor can comprise 5 or more elements if desired. In some embodiments, the composition of the semiconductor nanoparticle may include Group IV compounds, Group II-VI compounds, Group II-V compounds, Group III-VI compounds, Group III-V compounds, Group IV-VI compounds, Group I-III-VI compounds, Group II-IV-VI compounds, Group II-IV-V compounds, or any combination thereof. In some embodiments, the composition of the semiconductor nanoparticles may include metal oxides such as ZnO and $TiO_2$. In some embodiments, the composition of the semiconductor nanoparticles may include perovskite materials such as methylammonium lead trihalides. In some embodiments, the semiconductor nanoparticles may include CdS, CdSe, CdTe, ZnS, ZnSe, ZnTe, InP, $CuInSe_2$, or any combination thereof. In some embodiments, the semiconductor nanoparticles may include a heterojunction. In some embodiments, the semiconductor nanoparticles may comprise a graded composition whereby the composition transitions from a first composition to a second composition over a distance.

The semiconductor nanoparticles can be undoped; or doped with rare earth elements, such as Eu, Er, Tb, Tm, Dy; and/or transition metal elements, such as Mn, Cu, and Ag; or any combination thereof.

In some embodiments, the semiconductor nanoparticles have at least one dimension 100 nanometers or less in length, 50 nanometers or less in length, or even 20 nanometers or less in length. In some embodiments, the size of the semiconductor nanoparticles in the light emission layer may have a distribution. In some embodiments, the size distribution of the semiconductor nanoparticles may be unimodal or multimodal. In some embodiments, the semiconductor nanoparticles have isotropic dimensionality or non-isotropic dimensionality.

In some embodiments, the semiconductor nanoparticles can have a core-shell structure whereby an additional material (known as a "shell") is coated on the outside of an inner portion of the semiconductor nanoparticle. The shell may be composed of a semiconductor or an insulator. In some embodiments, the composition of the shell may include Group IV compounds, Group II-VI compounds, Group II-V compounds, Group III-VI compounds, Group III-V compounds, Group IV-VI compounds, Group I-III-VI compounds, Group II-IV-VI compounds, Group II-IV-V compounds, or any combination thereof. In another embodiments, the composition of the shell may include metal oxides such as ZnO and $TiO_2$. In another embodiment, the composition of the shell may include perovskite materials such as methylammonium lead trihalides. In some embodiments, the composition of the shell may include CdS, CdSe, CdTe, ZnS, ZnSe, ZnTe, InP, $CuInSe_2$, or any combination thereof. In some embodiments, the shell may comprise a single layer or multiple layers. In some embodiments, the shell may comprise a graded composition whereby the composition transitions from a first composition to a second composition over a distance. In some embodiments, the composition may be continuously graded from the inner portion of the semiconductor nanoparticle to the shell. In some embodiments, the shell can have a thickness of 100 nanometers or less, 50 nanometers or less, or even 5 nanometers or less.

The surface of the semiconductor nanoparticles may be populated with molecules, sometimes referred to as ligands, such as alkylphosphines, alkylphosphine oxides, amines, carboxylic acids, and the like and/or endcapping inorganic molecules to allow for the dispersion in a variety of solvents and to control aggregation and coalescence between nanoparticles.

The ligand molecules may be covalently or non-covalently attached to the quantum dots through functional groups capable of making a covalent or non-covalent interaction with the outermost layer of the quantum dot. In some embodiments the functional group may be selected from a list including, but not limited to, phosphines, phosphine oxides, carboxylic acids, amines, and alcohols. In some embodiments, a second functional group may be present on the ligand, such that the first functional group interacts with the quantum dot surface and the second functional group interacts with the ligands on adjacent quantum dot.

In some embodiments, the functional group on the ligand molecule may have an organic substituent such as, but not limited to, saturated alkyl groups, unsaturated alkyl groups, aromatic groups, linear alkyl groups, non-linear alkyl groups, branched alkyl groups, ether groups, or amine groups. In some embodiments the ligand layer may consist of a mixture of one or more types of molecules. The ligand layer may have any desired thickness according to the embodiments of the present invention. In some embodiments the ligand layer has a thickness of 15 nanometers or less, or 10 nanometers or less, or even 3 nanometers or less. In some embodiments the ligand molecules form a complete monolayer or a sub-monolayer on the surface of the quantum dot.

In some embodiments, the semiconductor nanoparticle can be one-dimensional. The one-dimensional nanoparticles have cross-sectional areas whose characteristic thickness dimension (e.g., the diameter for a circular cross-sectional area or a diagonal for a square or rectangular cross-sectional area) are 1 nm to 1000 nanometers (nm), preferably 2 nm to 50 nm, and more preferably 5 nm to 20 nm (such as about 6, 7, 8, 9, 10, 11, 12, 13, 14, 15, 16, 17, 18, 19, or 20 nm) in diameter. Nanorods are rigid rods that have circular cross-sectional areas whose characteristic dimensions lie within the aforementioned ranges. Nanowires or nanowhiskers are curvaceous and have different serpentine or vermicular shapes. Nanoribbons have cross-sectional areas that are bounded by four or five linear sides. Examples of such cross-sectional areas are square, rectangular, parallelepipeds, rhombohedrals, and the like. Nanotubes have a substantially concentric hole that traverses the entire length of the nanorod, thereby causing it to be tube-like. The aspect ratios of these one-dimensional nanoparticles are greater than or equal to 2, preferably greater than or equal to 5, and more preferably greater than or equal to 10.

The one-dimensional nanoparticles have a length of 10 to 100 nanometers, preferably 12 to 50 nanometers and more preferably 14 to 30 nanometers. The one-dimensional nanoparticle can have a diameter of 2 to 10 nanometers, preferably 3 to 7 nanometers. The one-dimensional nanoparticles have an aspect ratio that is greater than or equal to about 2, preferably greater than or equal to about 4.

In one exemplary embodiment, the semiconductor nanoparticles comprise a one-dimensional nanoparticle that has disposed at either or each end a single endcap or a plurality of endcaps that contact the one-dimensional nanoparticle. In one embodiment, the endcaps also contact each other. The endcaps serve to passivate the one-dimensional nanoparticles. The nanoparticles can be symmetrical or asymmetrical about at least one axis. The nanoparticles can be asymmetrical in composition, composition of the endcap, in geometric structure and electronic structure, or in both composition and structure.

In one embodiment, the nanoparticle comprises a one-dimensional nanoparticle that comprises an endcap at each opposing end along its longitudinal axis. Each endcap has a different composition, thus providing the nanoparticle with multiple heterojunctions. In another embodiment, the nanoparticle comprises a one-dimensional nanoparticle that comprises an endcap at each opposing end along its longitudinal axis and further comprises nodes disposed on a radial surface of the one-dimensional nanoparticle or on the endcaps. The radial surface is also termed the lateral surface of the rods. The endcaps can have similar or different compositions from each other and/or the nodes can have similar or different compositions from each other so long as one of the endcaps has a different composition from either the other endcap or from at least one of the nodes.

In one embodiment, the plurality of endcaps comprises a first endcap and a second endcap that partially or completely encircles the first endcap. The endcaps are three dimensional nanoparticles, at least one of which directly contacts the one-dimensional nanoparticle. Each endcap may or may not contact the one-dimensional nanoparticle. The first endcap and the second endcap can have different compositions from each other. The nodes are also three dimensional nanoparticles that can be smaller or larger in size than the endcaps.

The term "heterojunction" implies structures that have one semiconductor material in direct contact with another semiconductor material.

The one-dimensional nanoparticle, the first endcap and the second endcap each comprises semiconductors. The interface between the nanorods and the first endcap provides a first heterojunction, while the interface between the first endcap and the second endcap provides a second heterojunction. In this manner the nanoparticles may comprise a plurality of heterojunctions.

In one embodiment, the heterojunction at which the one dimensional nanoparticle contacts the first endcap has a type I or quasi-type II band alignment. In another embodiment, the point at which the second endcap contacts the first endcap has a type I or quasi-type II band alignment.

The first endcap and the second endcap are chemically different from each other and are selected from the group consisting of Si, Ge, Pb, SiGe, ZnO, $TiO_2$, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or the like, or a combination comprising at least one of the foregoing semiconductors. In an exemplary embodiment, the first endcap is CdTe or CdSe, while the second endcap is ZnSe.

By changing the composition and size (diameter or length) of the one-dimensional nanoparticle, the first endcap and/or the second endcap, the energy band gap and band offsets can be varied. Varying the energy band gap can be used to change wavelength, the efficiency and intensity of light generation in the nanoparticles. In one embodiment, the conduction band offset between the first endcap and the one dimensional nanoparticle is much higher than the conduction band offset between the first endcap and the second endcap, and where the valence band offset between the first endcap and the one-dimensional nanoparticle is much lower than one between the first endcap and the second endcap. In another embodiment, the conduction band offset between the first endcap and one-dimensional nanoparticle is much lower than one between the first endcap and the second endcap, and where the valence band offset between the first endcap and one-dimensional nanoparticle is much lower than one between the first endcap and the second endcap. In yet another embodiment, one of two heterojunctions that are formed by the first endcap has a smaller conduction band offset and a larger valence band offset than others, and the other has larger conduction band offset and smaller valence band offset.

In one embodiment, the nanoparticles comprise two types of heterojunctions where the type II staggered band offset allows for the efficient injection of electrons and holes, while the type I offset defines a recombination center for highly efficient light emission.

In one embodiment the nanoparticles may be used to form layers or films. In one embodiment, the layers may be disordered. In another embodiment, the layers may have liquid crystalline character. In another embodiment, the layers may contain ordering in a single dimension. In another embodiment, the layers may contain ordering in two dimensions, or in three dimensions. In another embodiment, the nanoparticles may self-assemble into lattices within the film.

In some embodiments, anisotropic nanoparticles may be aligned in the layers within a device. In one embodiment the anisotropic nanoparticles may be aligned such that the one-dimensional axis of the particle is normal to the surface of the layer. In another embodiment, the anisotropic nanoparticles may be aligned within the plan of the layer. In another embodiment, the anisotropic particles may be aligned such that a plurality of the anisotropic particles one dimensional axes are aligned in the same direction.

Polymer for Hole Injection/Transport Layer

The polymer of the present invention comprises a wide variety of polymer compositions. Some preferred types of polymers are vinyl polymers, polyurethanes, polyamides, polycarbonates, polyepoxies, and conjugated polymers. That is, the polymer preferably contains the reaction products of carbon-carbon double bonds, or urethane linkages, or urea linkages, or ester linkages, or amide linkages, or —OCH$_2$CH(OH)CH$_2$— linkages; or sp$^2$ hybridized carbon-carbon single bonds; more preferably reaction products of carbon-carbon double bonds or sp$^2$ hybridized carbon-carbon single bonds; more preferably reaction products of carbon-carbon double bonds.

The polymer contains the structure (S1):

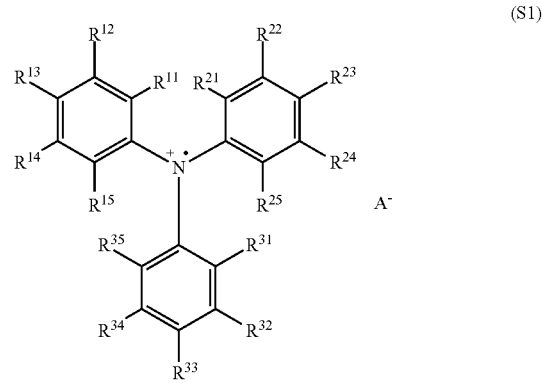

The structure (S1) is referred to herein as a triaryl aminium radical cation.

The groups $R^{11}$, $R^{12}$, $R^{13}$, $R^{14}$, $R^{15}$, $R^{21}$, $R^{22}$, $R^{23}$, $R^{24}$, $R^{25}$, $R^{31}$, $R^{32}$, $R^{33}$, $R^{34}$, and $R^{35}$ are called herein the "S1R groups." Each of the S1R groups is independently selected from hydrogen, deuterium, halogens, amine groups, hydroxyl groups, sulfonate groups, nitro groups, and organic groups. One or more of the S1R groups is covalently bound to the polymer.

In some embodiments (herein "ring embodiments"), two or more S1R groups are covalently bound to each other to form a ring structure. Among ring embodiments, preferred are those in which either (i) the pair of S R groups that are bound to each other are adjacent to each other on a single aromatic ring or (ii) the pair of S1R groups is selected from the following: $R^{31}$ to $R^{25}$; $R^{15}$ to $R^{35}$; and $R^{11}$ to $R^{21}$. In case (ii), it is possible that the two bonded S1R groups are combined in such a way that a single atom of the combined S1R group is bonded to two of the aromatic rings shown in structure (S1). Another possibility in case (ii) is that combined S1R group has no atoms; such an S1R group would consist of a bond that connected a carbon atom on one of the aromatic rings shown in structure (S1) to a carbon atom on one of the other aromatic rings shown in structure (S1).

Each aminium radical cation S1 group is associated with an anion A$^-$. The anion A$^-$ may be any composition. The anion A$^-$ may be located in any of a variety of places. For example, A$^-$ may be a group that is covalently attached to the polymer that contains structure (S1), or A$^-$ may be a separate atom or molecule. Preferably, A$^-$ is not covalently bound to the polymer that contains structure (S1). A$^-$ may be an atomic anion or a molecular anion. Molecular anion may be a dimer or an oligomer or a polymer or a molecule that is not a dimer or an oligomer or a polymer. Preferably, A$^-$ is a molecular anion that is not a polymer.

Preferred anions A$^-$ are BF$_4^-$, PF$_6^-$, SbF$_6^-$, AsF$_6^-$, ClO$_4^-$, anions of structure SA, anions of structure MA, and mixtures thereof. Structure SA is

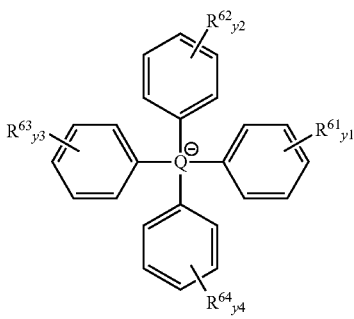

(SA)

where Q is B, Al, or Ga, preferably B, and where each of y1, y2, y3, and y4 is independently 0 to 5, meaning that there are zero to 5 R groups (i.e, $R^{61}$ or $R^{62}$ or $R^{63}$ or $R^{64}$) present on each of the four aromatic rings appearing in structure (SA). Any pair of the R groups in structure (SA) may be the same as each other or different from each other. Each R group in structure (SA) is independently selected from hydrogen, deuterium, a halogen, an alkyl, or a halogen-substituted alkyl. Any two R groups in structure (SA) may be bonded together to form a ring structure. Among anions with structure SA, preferred are those with one or more R groups selected from deuterium, fluorine, and trifluormethyl.

Structure MA is

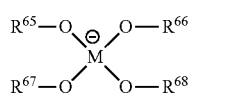

(MA)

where M is B, Al, or Ga, preferably Al; and where each of $R^{65}$, $R^{66}$, $R^{67}$, and $R^{68}$ is independently alkyl, aryl, fluoroaryl, or fluoroalkyl. Preferably structure MA has 50 or fewer non-hydrogen atoms. Preferred anions are $BF_4^-$ and anions of structure (SA); more preferably anions of structure (SA).

In some suitable embodiments, $A^-$ has the structure (SA) where one $R^{61}$ group or one $R^{62}$ group or one $R^{63}$ group or one $R^{64}$ group or a combination thereof has the structure (SA2):

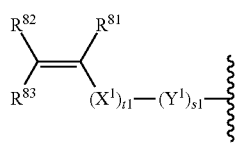

(SA2)

where each of $R^{S1}$, $R^{S2}$, and $R^{S3}$ is hydrogen or a hydrocarbon group having 1 to 20 carbon atoms; where $X^1$ is an alkylene group having 1 to 20 carbon atoms; where $Y^1$ is an allylene group having 6 to 20 carbon atoms; where s1 is 0 or 1; where t1 is 0 or 1; and where (t1+s1) is 1 or 2. In structure (SA2), the $Y^1$ group farthest to the right is bonded to a carbon atom in an aromatic ring shown if structure (SA), which in turn is bonded to Q. When structure (SA2) is present, the preferred Q is boron.

Preferably the polymer is a vinyl polymer. When the polymer is a vinyl polymer, one or more of the S1R groups contains one or more residues of a reaction of a carbon-carbon double bond with other carbon-carbon double bonds in a vinyl polymerization reaction. Also contemplated are embodiments in which the polymer is the result of a polymerization reaction that includes a reaction of complementary reactive groups G1 and G2; in such embodiments, one of the following situations occurs:

(a) one or more of the S1R groups contains a residue of G1 after it has reacted with G2, and a different one of the S1R groups on the same structure (S1) contains a residue of G2 after it has reacted with G1, or (b) some of the polymerized units, two or more of the S1R groups each contain a residue of G1 after it has reacted with G2, and on other of the polymerized units, two or more of the S1R groups each contain a residue of G2 after it has reacted with G1.

Preferably, two or more of the S1R groups are hydrogen; more preferably 4 or more; more preferably 6 or more; more preferably 8 or more; more preferably 10 or more. Among S1R groups that are not hydrogen, preferred are organic groups having 50 or fewer carbon atoms. Preferably, one or more of $R^{11}$, $R^{12}$, $R^{13}$, $R^{14}$, and $R^{15}$ is an organic group having one or more aromatic groups. Preferably, one or more of $R^{21}$, $R^{22}$, $R^{23}$, $R^{24}$, and $R^{25}$ is an organic group having one or more aromatic groups. Preferably, one or more of $R^{31}$, $R^{32}$, $R^{33}$, $R^{34}$, and $R^{35}$ is an organic group having one or more aromatic groups. Preferably, each of $R^{11}$, $R^{12}$, $R^{13}$, $R^{14}$, and $R^{15}$ is either hydrogen or a hydrocarbyl group. Preferably, each of $R^{21}$, $R^{22}$, $R^{23}$, $R^{24}$, and $R^{25}$ is either hydrogen or a hydrocarbyl group. Preferably, each of $R^{31}$, $R^{32}$, $R^{33}$, $R^{34}$, and $R^{35}$ is either hydrogen or an organic group containing one or more heteroatoms; preferred heteroatom is nitrogen; preferably the heteroatom is part of a heteroaromatic groups. Preferably, any S1R group that is not hydrogen has 50 or fewer atoms other than hydrogen.

Among S1R groups that are not hydrogen, preferred organic groups are the following. The point of attachment to structure (S1) is shown by the jagged line symbol $\mathcal{M}$. Where a single group has two points of attachment, that group attaches to two adjacent carbon atoms on one of the aromatic rings in structure (S1).

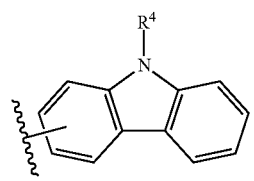

(S4)

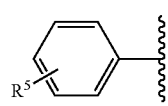

(S5)

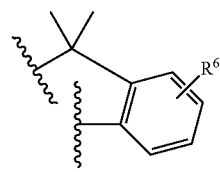

(S6)

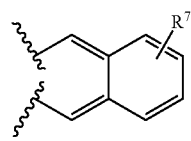

(S7)

(S8) 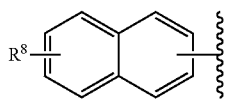

(S9) 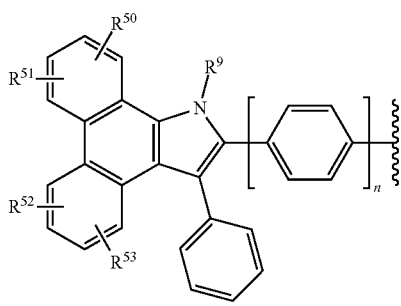

(S10) 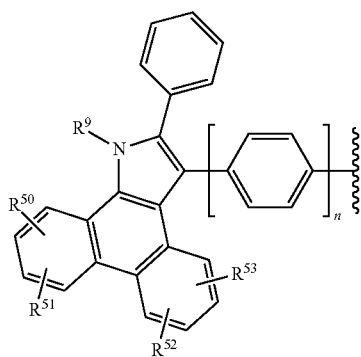

(S11) 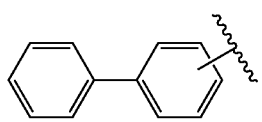

(S12) 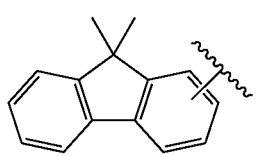

(S13) 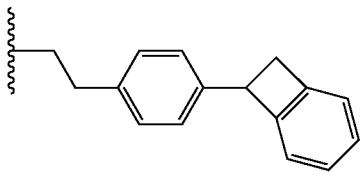

Wherein each of $R^4$, $R^5$, $R^6$, $R^7$, $R^8$, $R^9$, $R^5$, $R^{51}$, $R^{52}$, and $R^{53}$ is a hydrogen or an organic group. Preferably $R^5$ is a hydrogen, an alkyl group, or an organic group containing an aromatic ring. One preferred $R^5$ is a structure (S14), where the portion in brackets is the residue of a reaction of a carbon-carbon double bond with another carbon-carbon double bonds in a vinyl polymerization reaction. Preferably n is 1 or 2. Preferred organic groups have 50 or fewer atoms other than hydrogen. Structure (S14) is the following:

where $R^{54}$ is hydrogen or an alkyl group, preferably hydrogen or a $C_1$ to $C_4$ alkyl group, preferably hydrogen or methyl, more preferably hydrogen.

Preferably $R^4$ is an alkyl group (preferably methyl) or a group of structure (S5). In some embodiments, when $R^4$ has structure S5, $R^5$ is structure (S14), and $R^{14}$ is hydrogen. Preferably $R^6$ is hydrogen. Preferably $R^7$ is hydrogen. Preferably $R^8$ is hydrogen. In structures (S9) and (S10), each of $R^9$, $R^{50}$, $R^{51}$, $R^{52}$, and $R^{53}$ is preferably hydrogen, an alkyl group, or a group of structure (S5). In structures (S9) and (S10), n is an integer from 0 to 10; preferably 0 to 2.

Preferably, $R^{11}$, $R^{12}$, $R^{14}$, and $R^{15}$ are all hydrogens. Preferably, $R^{21}$, $R^{22}$, $R^{24}$, and $R^{25}$ are all hydrogens. Preferably, $R^{31}$, $R^{34}$, and $R^{35}$ are all hydrogens. More preferred are embodiments (herein called "(I)" embodiments, in which $R^{11}$, $R^{12}$, $R^{14}$, $R^{15}$, $R^{21}$, $R^{22}$, $R^{24}$, $R^{25}$, $R^{31}$, $R^{34}$ and $R^{35}$ are all hydrogens.

Also preferred are embodiments (herein called "(II)" embodiments), in which $R^{32}$ and $R^{33}$ together have structure (S6), preferably where $R^6$ is hydrogen.

Among I embodiments, preferred are those that are also II embodiments.

Some preferred embodiments, labeled herein A embodiments, B embodiments, and C embodiments, are as follows.

In A embodiments, $R^{23}$ is structure (S4), preferably with $R^4$ having structure (S5), preferably with $R^5$ having structure (S14), preferably with $R^{54}$ being hydrogen. Among A embodiments, preferably $R^{13}$ is structure (S5), preferably with $R^5$ being a hydrogen. Preferred A embodiments are also I embodiments.

In B embodiments, $R^{23}$ is structure (S5), preferably with $R^5$ having structure (S14), preferably with $R^{54}$ being hydrogen. Among B embodiments, preferably $R^{13}$ is structure (S4), preferably with $R^4$ having structure (S5), preferably with $R^5$ being a hydrogen. Preferred B embodiments are also I embodiments.

In C embodiments, $R^{23}$ is structure (S5), preferably with $R^5$ having structure (S14), preferably with $R^{54}$ being hydrogen. Among C embodiments, preferably $R^{13}$ is structure (S5), preferably with $R^5$ being a hydrogen. Preferred C embodiments are also I embodiments.

In some preferred embodiments, one or more of $R^{11}$, $R^{12}$, $R^{13}$, $R^{14}$, $R^{15}$, $R^{21}$, $R^{22}$, $R^{23}$, $R^{24}$, $R^{25}$, $R^{31}$, $R^{32}$, $R^{33}$, $R^{34}$, and $R^{35}$ is selected from substituted or unsubstituted phenyl, substituted or unsubstituted carbazolyl, substituted or unsubstituted indolyl, substituted or unsubstituted fluorenyl, or substituted or unsubstituted biphenyl.

In some preferred embodiments, structure (S1) has the structure (S201):

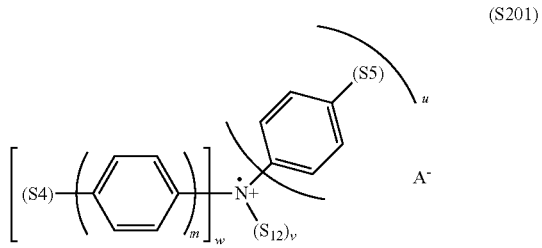

(S201)

Where A, S4, S5, and S12 are defined above. The index m is 0 or 1. The index u is 0 to 3, and it denotes that 0 to 3 groups in curved brackets with subscript u may be attached to the nitrogen atom. Each S5 group has an $R^5$ group attached to it. In these embodiments, $R^5$ is H or styrenyl or vinyl. If u is 2 or 3, each of the various $R^8$ groups is chosen independently of the other $R^8$ groups. The index v is 0 to 3, and it denotes that 0 to 3 (S12) groups may be attached to the nitrogen atom. The index w is 0 to 3, and it denotes that 0 to 3 of the groups in square brackets may be attached to the nitrogen atom. Each S4 group has an $R^4$ group attached to it. In these embodiments, $R^4$ is H or styrenyl or vinyl. If w is 2 or 3, each of the various $R^4$ groups is chosen independently of the other $R^4$ groups. Also, (u+v+w)=3.

Preferably, the polymer contains, in addition to structure (S1), one or more triaryl amine structures having structure (S2):

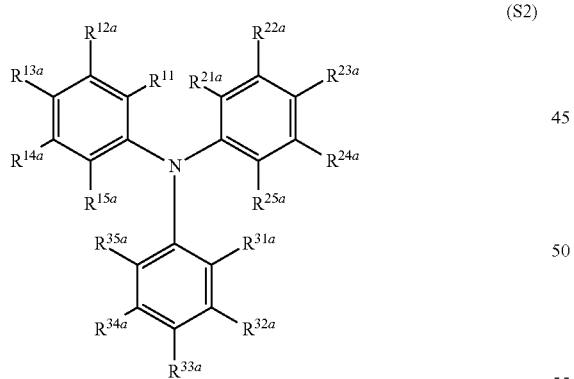

(S2)

The suitable and preferred structures for $R^{11a}$, $R^{12a}$, $R^{13a}$, $R^{14a}$, $R^{15a}$, $R^{21a}$, $R^{22a}$, $R^{23a}$, $R^{24a}$, $R^{25a}$, $R^{31a}$, $R^{32a}$, $R^{33a}$, $R^{34a}$, and $R^{35a}$ are the same as those described above for $R^{11}$, $R^{12}$, $R^{13}$, $R^{14}$, $R^{15}$, $R^{21}$, $R^{22}$, $R^{23}$, $R^{24}$, $R^{25}$, $R^{31}$, $R^{32}$, $R^{33}$, $R^{34}$, and $R^{35}$ in structure (S2). The groups $R^{11a}$, $R^{12a}$, $R^{13a}$, $R^{14a}$, $R^{15a}$, $R^{21a}$, $R^{22a}$, $R^{23a}$, $R^{24a}$, $R^{25a}$, $R^{31a}$, $R^{32a}$, $R^{33a}$, $R^{34a}$, and $R^{35a}$ are known herein as the S2R groups. Each S2R group has a label of format $R^{ija}$ and is said herein to correspond to the S1R group having label of format $R^{ij}$ and having the same values of i and j. For example, $R^{31a}$ in S2 is said to correspond to $R^{31}$ in S1. Each S2R group may or may not be the same as the corresponding S1R group. In some embodiments, one or more S2R group(s) is (are) different from its (their) corresponding S1R group(s). Preferably, the polymer contains one or more S2 groups in which every S2R group is the same as the corresponding S1R group.

The following is a list ("list A") of suitable S2 structures. It is noted that each structure in list A contains a nitrogen atom attached to three aromatic rings (the "triaryl" nitrogen). It is contemplated that the triaryl nitrogen atom in each structure in list A could be oxidized to form an aminium radical cation, thus forming a suitable S1 structure that corresponds to the S2 structure shown in list A. List A is as follows:

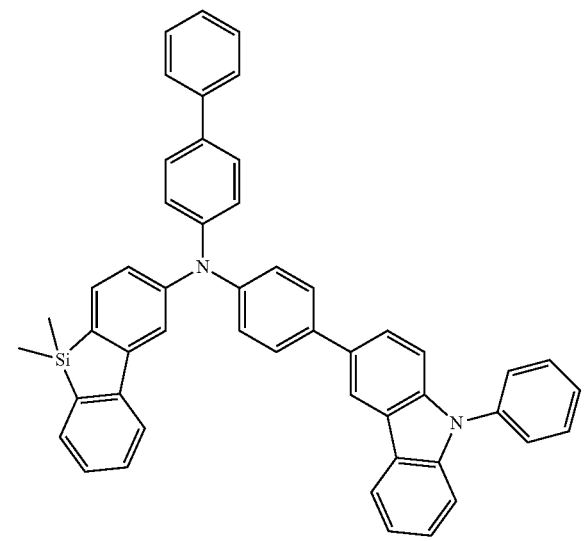

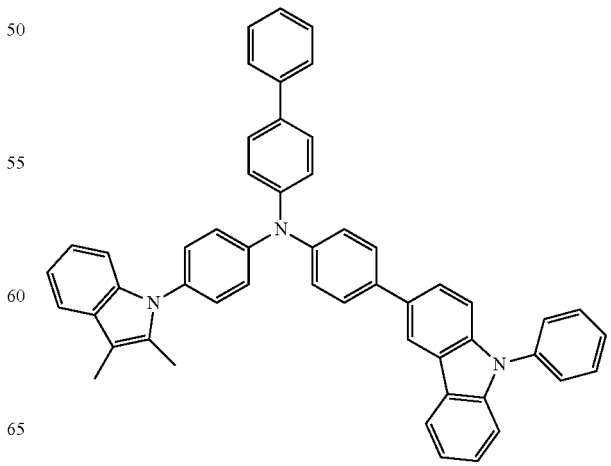

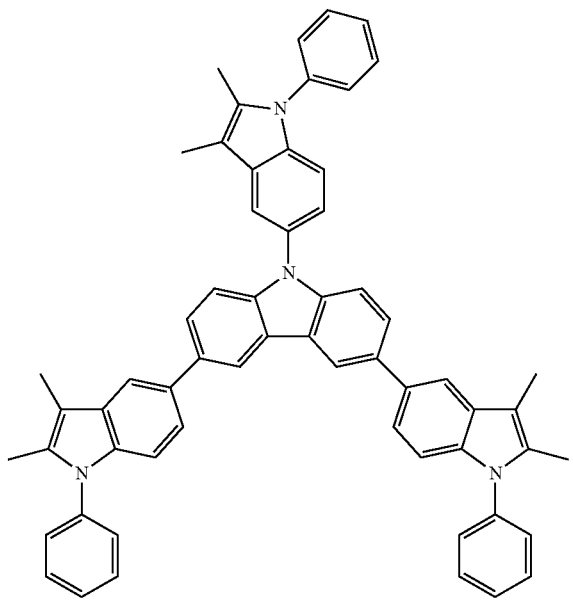
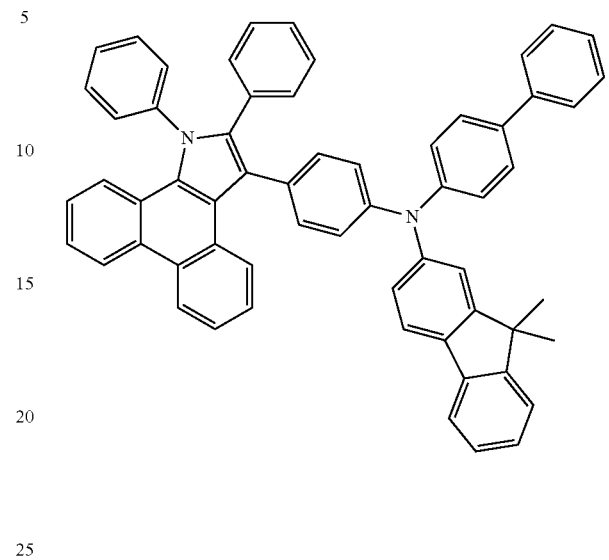
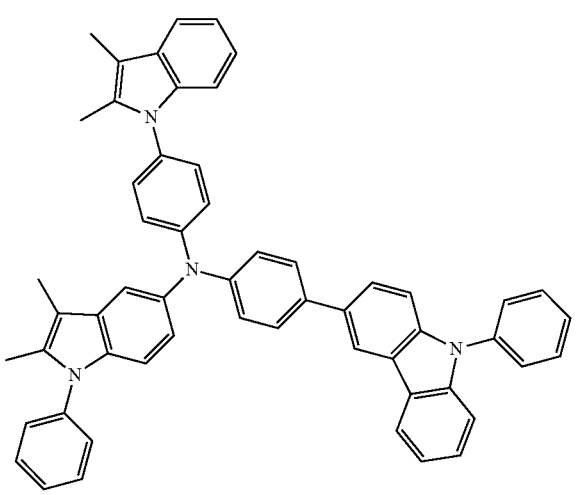
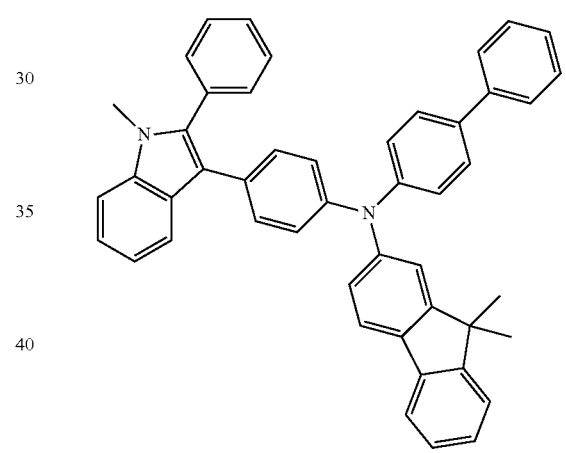
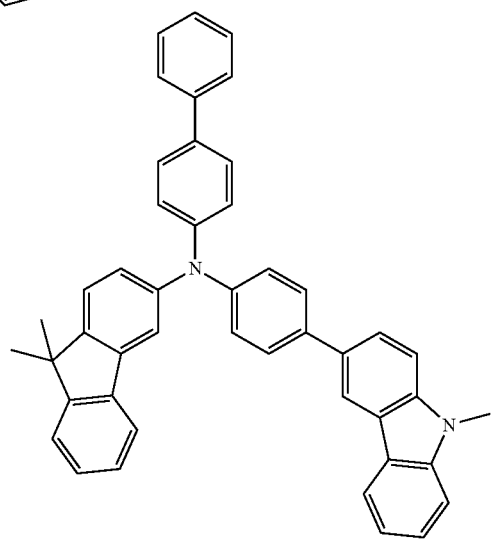
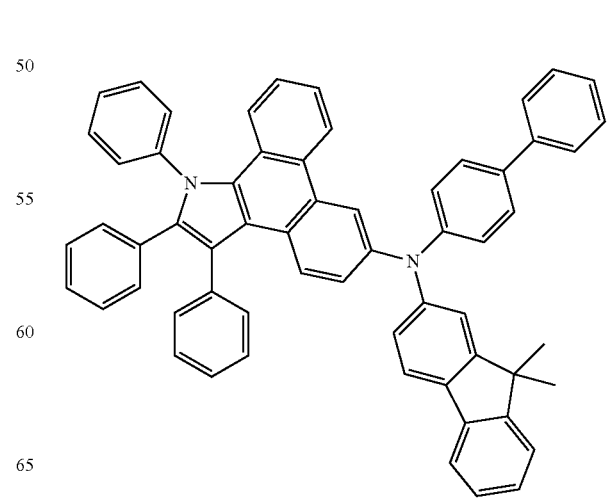

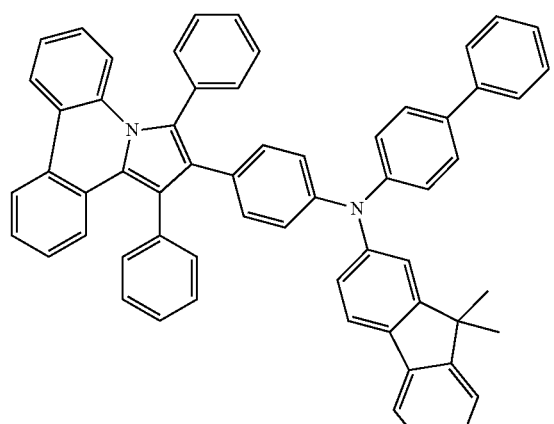
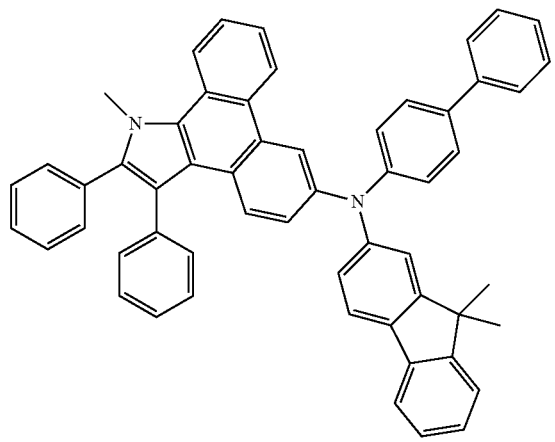
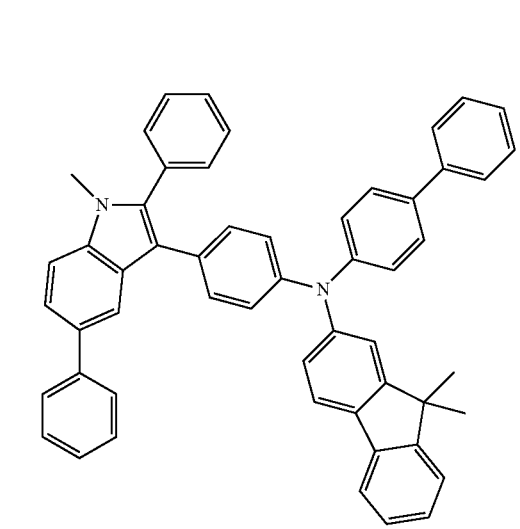
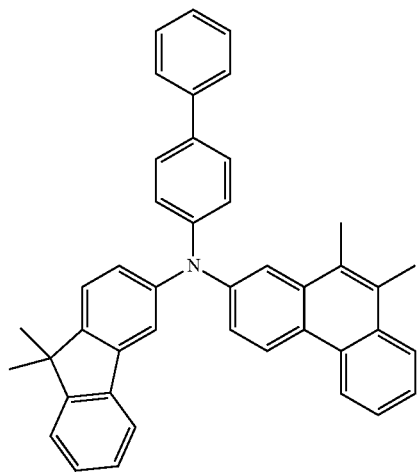
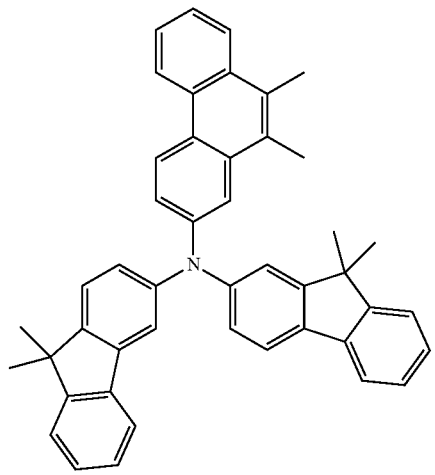
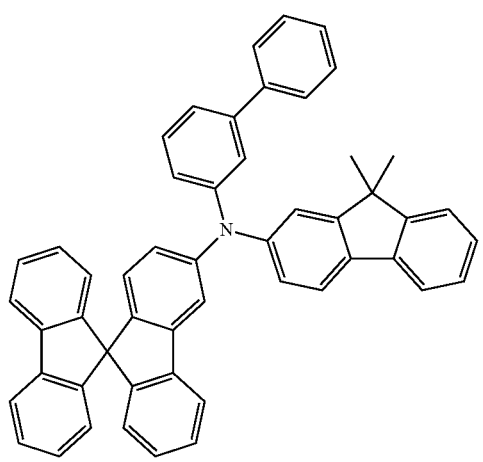

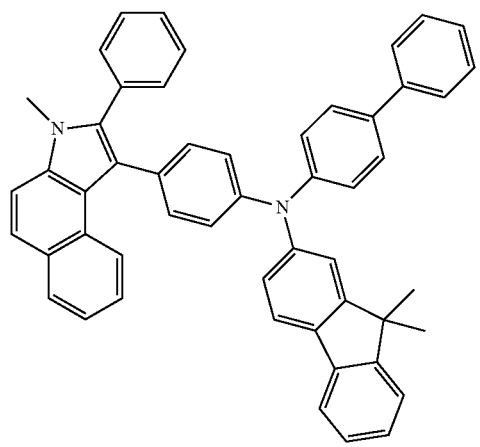
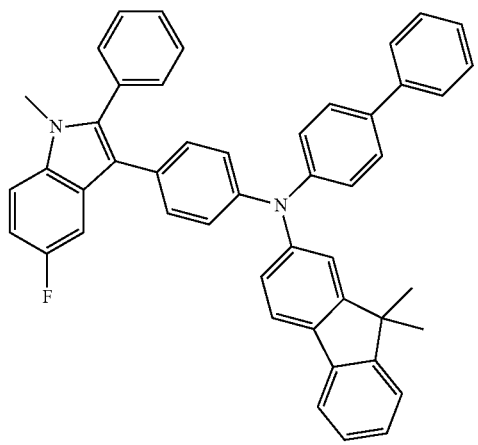
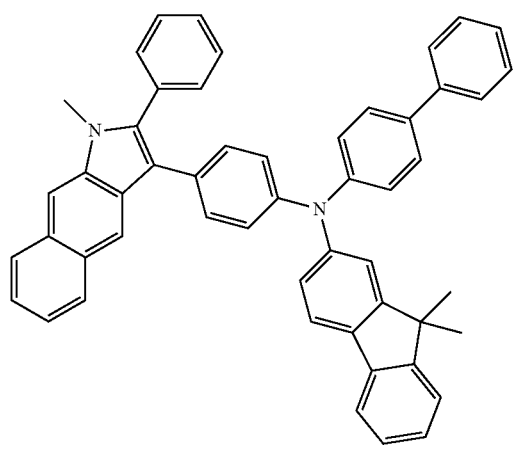
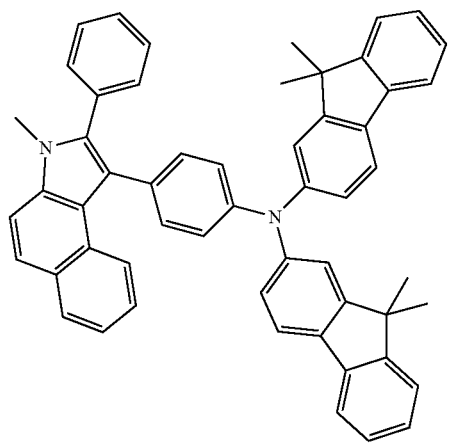
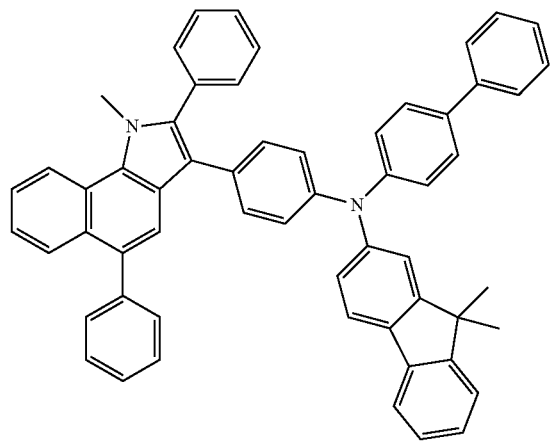
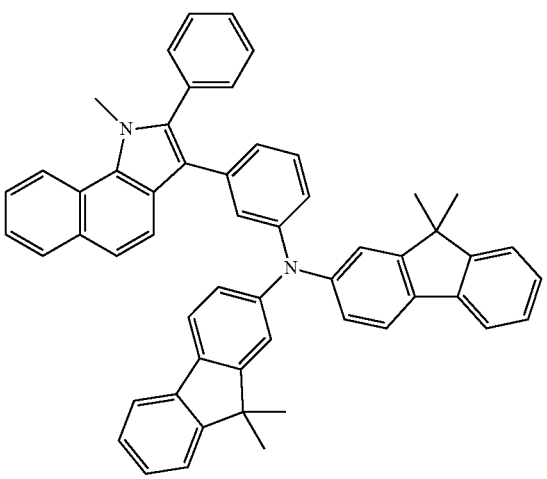

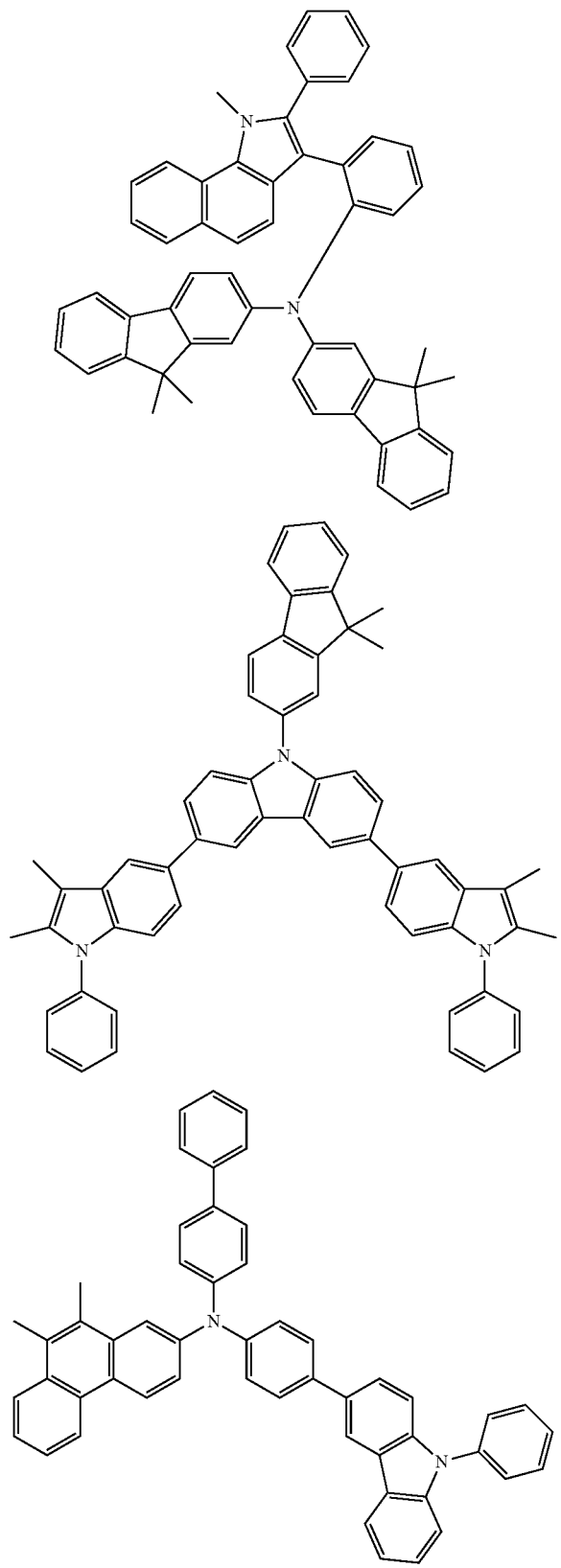
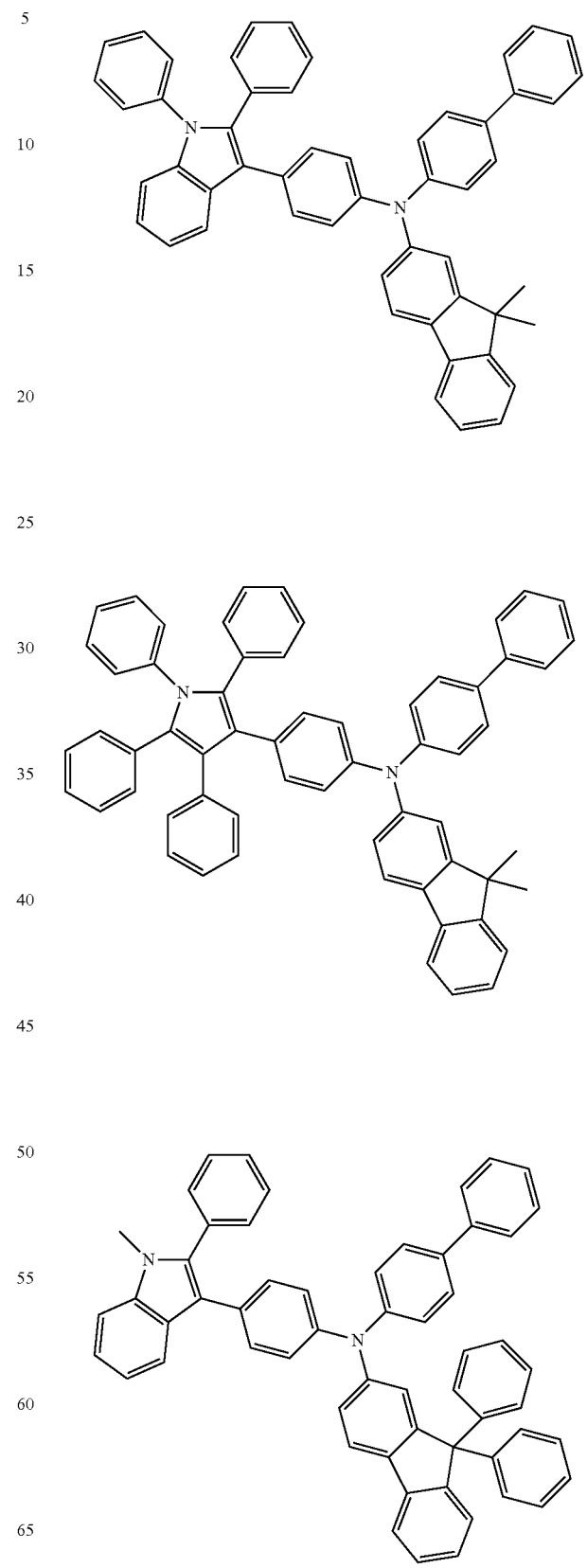

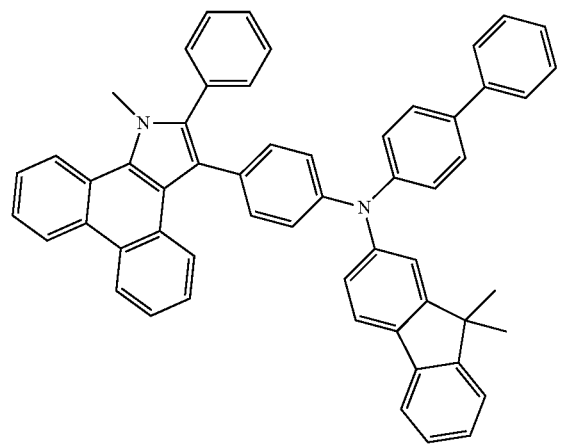
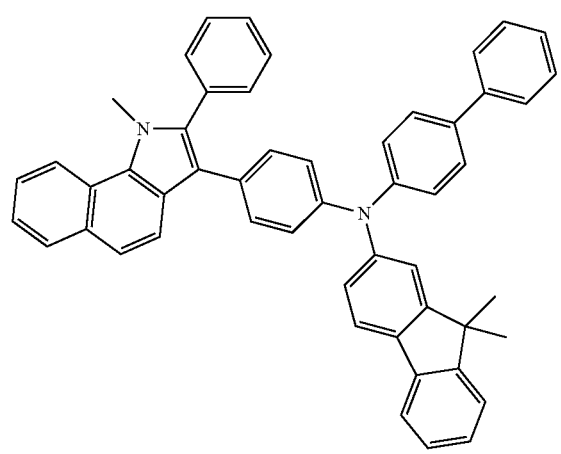
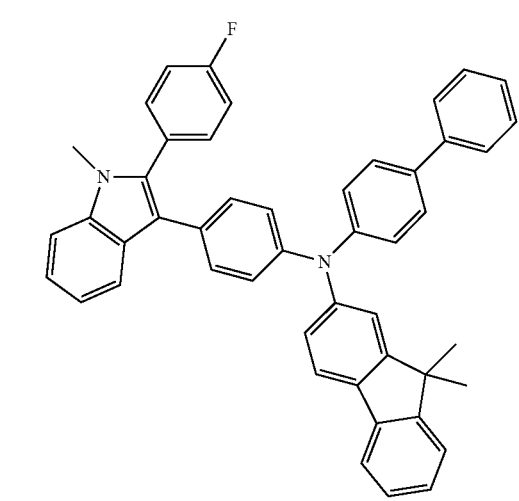
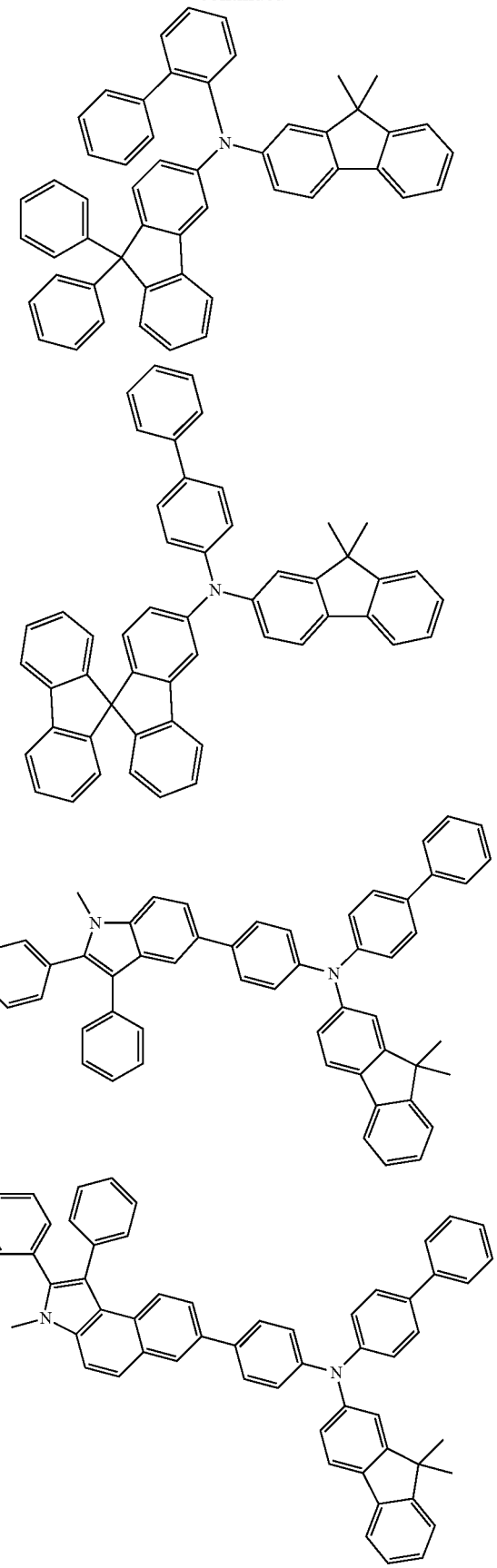

-continued

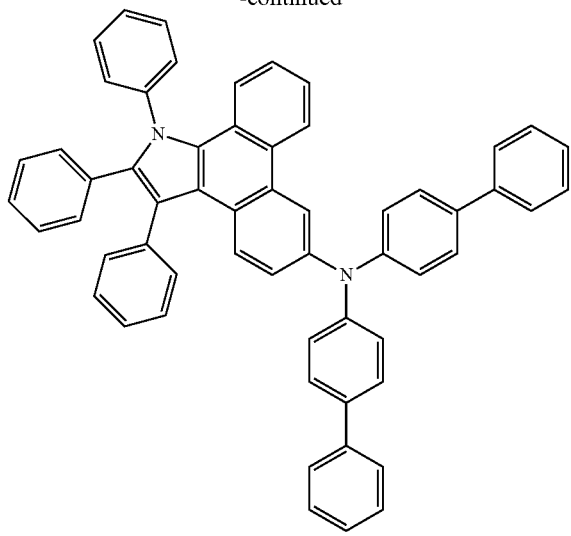

Preferably, in the polymer of the present invention, the mole ratio of S2 groups to S1 groups is 999:1 or lower; more preferably 500:1 or lower; more preferably 99:1 or lower; more preferably 50:1 or lower; more preferably 20:1 or lower. Preferably, in the polymer of the present invention, the mole ratio of S2 groups to S1 groups is 0.001: or greater; more preferably 2:1 or greater; more preferably 3.5:1 or greater; more preferably 5.5:1 or greater.

The polymer of the present invention preferably has number-average molecular weight of 2,500 Da or higher; more preferably 5,000 Da or higher, more preferably 10,000 Da or higher; more preferably 20,000 Da or higher; more preferably 40,000 Da or higher; more preferably 60,000 Da or higher. The polymer of the present invention preferably has number-average molecular weight of 500,000 Da or lower; more preferably 300,000 Da or lower; more preferably 150,000 Da or lower.

In some embodiments, the composition of the present invention contains both the polymer described above and one or more additional polymers that contains no structure S1. In some embodiments, the composition contains one or more polymers that contains no structure S1 and no structure S2. If any such additional polymer is present, preferably the additional polymer is the same type of polymer as the polymer that contains structure S.

Preferably, the polymer of the present invention is at least 99% pure, as measured by liquid chromatography/mass spectrometry (LC/MS) on a solids weight basis, more preferably at least 99.5%, more preferably at least 99.7%. Preferably, the formulation of this invention contains no more than 10 ppm by weight of metals, preferably no more than 5 ppm.

The polymer of the present invention may be made by any method. One method is to polymerize one or more monomers that contain a structure S1, optionally along with one or more other monomers. A preferred method is to first polymerize one or more monomers that contains a structure S2, optionally along with one or more other monomers, and then to subject the resulting polymer to a chemical reaction that converts some or all of the structures S2 in the polymer to structures S1. A preferred method of converting some or all of the structures S2 to structures S1 is to react the polymer that contains structures S2 with one or more oxidizing agents. The reaction with an oxidizing agent is contemplated to proceed as shown in reaction X1:

$$OA^{\oplus}X^{\ominus}+S2 \rightarrow OA+S2^{\oplus}X^{\ominus} \tag{X1}$$

where $OA^{\oplus}$ is the oxidizing agent, $X^{\ominus}$ is an anion, and $S2^{\oplus}$ is the same as S1. Preferably, the mole ratio of $OA^{\oplus}$ to S2 is 25:1 or lower; more preferably 20:1 or lower; more preferably 15:1 or lower. Preferably, the mole ratio of $OA^{\oplus}$ to S2 is 2:1 or greater; more preferably 4:1 or greater; more preferably 8:1 or greater.

Preferred oxidizing agents are compounds containing Ag(I) ions (that is, silver ions with +1 valence) and compounds containing nitrosonium ions. Among compounds containing Ag(I) ions, preferred is Ag(I) tetra(pentafluorophenyl)borate. Among compounds containing nitrosonium ions, preferred is $NOBF_4$. In some embodiments, $OA^{\oplus}$ is an onium compound.

Preferably, the reaction between the polymer and the oxidizing agent is carried out in an organic solvent. When the oxidizing agent is a compound containing a Ag(I) ion, preferred solvents contain one or more aromatic rings; more preferably the aromatic ring has no heteroatom; more preferably the solvent contains one or more heteroatoms that is not located within an aromatic ring; more preferably the solvent is anisole. When the oxidizing agent is a compound containing a nitrosonium ion, preferred solvents contain no aromatic ring; more preferred are non-aromatic solvents that contain one or more heteroatoms; more preferred are acetonitrile, dichloromethane, and mixtures thereof.

The polymer may be made by any polymerization method.

In a preferred polymerization method ("vinyl polymerization"), a first monomer is provided that contains structure S2 and that also contains one or more vinyl groups. Preferred vinyl groups have the structure (S15)

where $R^{54}$ is hydrogen or alkyl, preferably hydrogen or methyl, more preferably hydrogen. Preferably, the attachment point shown in structure S15 attaches to a carbon atom in an aromatic ring. The first monomer may optionally be mixed with additional monomers that contain a vinyl group, and these additional monomers may or may not contain a structure S2 that is different from the S2 group in the first monomer. Preferably, the first monomer contains exactly one vinyl group per molecule. Optionally, one or more of any additional monomers may be monomers that contain two or more vinyl groups per molecule. In vinyl polymerization, the various vinyl groups participate in a polymerization reaction to form a vinyl polymer. The vinyl polymerization may proceed by free-radical polymerization or by one or more other mechanisms; preferably by free-radical polymerization. Preferably, after polymerization, some or all of the S2 groups are converted to S1 groups by an oxidation reaction.

Also contemplated are other polymerization methods different from vinyl polymerization. Preferred among such methods are polymerization methods involving complementary reactive groups G1 and G2 that react with each other ("G1/G2" methods). In some embodiments, a primary monomer is provided that has two or more G1 groups per molecule, and that primary monomer is mixed with a secondary monomer that has two or more G2 groups per molecule, and one or both of the primary and secondary monomer has an S2 group. Then, when the G1 and G2 groups react with each other, a polymer is formed. In other embodiments, a monomer is provided that has a G1 group, a G2 group, and an S2 group. Then, when the G1 and G2 groups react with each other, a polymer is formed. In G1/G2 methods, additional monomers may optionally be present. Preferably, in G1/G2 methods, after polymerization, some or all of the S2 groups are converted to S1 groups by an oxidation reaction.

Preferably, the polymer of the present invention is present as a thin layer on a substrate. The film is preferably formed on a substrate by a solution process, preferably by spin coating or by an ink jet process.

When a solution is made for coating the polymer on a substrate, preferably the solvent has a purity of at least 99.8% by weight, as measured by gas chromatography-mass spectrometry (GC/MS), preferably at least 99.9% by weight. Preferably, solvents have an RED value (relative energy difference (versus polymer) as calculated from Hansen solubility parameter using CHEMCOMP v2.8.50223.1) less than 1.2, more preferably less than 1.0. Preferred solvents include aromatic hydrocarbons and aromatic-aliphatic ethers, preferably those having from six to twenty carbon atoms. Anisole, mesitylene, xylene, and toluene are especially preferred solvents.

Preferably, the thickness of the polymer films produced according to this invention is from 1 nm to 100 microns, preferably at least 10 nm, preferably at least 30 nm, preferably no greater than 10 microns, preferably no greater than 1 micron, preferably no greater than 300 nm.

When the film has been produced by spin coating, the spin-coated film thickness is determined mainly by the solid contents in solution and the spin rate. For example, at a 2000 rpm spin rate, 2, 5, 8, and 10 wt % polymer, formulated solutions result in film thicknesses of 30, 90, 160 and 220 nm, respectively. Preferably the wet film shrinks by 5% or less after baking and annealing.

In some embodiments (herein "gradient" embodiments), the polymer of the present invention is present as a "gradient layer", and has a concentration of S1 groups that is not uniform throughout the thickness of the layer. As portions of the gradient layer are examined in order from the portion closest to the anode to the portion closest to the emitting layer, the concentration of S1 groups may or may not change monotonically. For example, the concentration of S1 groups may increase monotonically, may decrease monotonically, may show a minimum, may show a maximum, or some combination thereof. The concentration of S1 may be assessed by any measure, including, for example, number of S1 groups per unit of volume, or number of S1 groups per unit of mass of polymer.

In the gradient layer, preferably, the concentration of S1 groups is higher in the portion of the gradient layer nearest the anode than in the portion of the gradient layer nearest the emitting layer. The concentration of S groups may vary gradually or in sudden steps or in some other way. Preferably, as portions of the gradient layer are examined in order from the portion closest to the anode to the portion closest to the emitting layer, at each portion the concentration of S1 groups is equal to or less than the concentration of S1 groups in the previous portion. The gradient layer may be constructed by a multi-step process, or the gradient layer may be constructed in some other way that results in the gradient of volume concentration of S1 groups. Preferably, the ratio of the concentration of S1 groups in the portion of the gradient layer nearest the anode to the concentration of S1 groups in the portion of the gradient layer nearest the emitting layer is higher than 1:1; or 1.1:1 or higher; or 1.5:1 or higher; or 2:1 or higher; or 5:1 or higher.

In embodiments in which S1 groups and S2 groups are both present in a gradient layer, it is useful to characterize the mole ratio of S2 groups to S groups. In the portion of the gradient layer nearest the anode, the mole ratio of S2 groups to S1 groups is defined herein as MRA:1. Preferably MRA is from 1 to 9. In the portion of the gradient layer nearest the emitting layer, the mole ratio of S2 groups to S1 groups is defined as MRE: 1. Preferably MRE is from greater than 9 to 999. Preferably MRA is less than MRE. Preferably the ratio of MRA to MRE is less than 1:1; more preferably 0.9:1 or less; more preferably 0.67:1 or less; more preferably 0.5:1 or less; more preferably 0.2:1 or less.

Preferably, the layer of the QLED that contains the polymer of the present invention is resistant to dissolution by solvent (solvent resistance is sometimes referred to as "solvent orthogonality"). Solvent resistance is useful because, after making the layer of the QLED that contains the composition of the present invention, a subsequent layer may be applied to the layer that contains the composition of the present invention. In many cases, the subsequent layer will be applied by a solution process. It is desirable that the solvent in the subsequent solution process does not dissolve or significantly degrade the layer that contains the composition of the present invention. Solvent resistance is assessed using the "strip test" described in the Examples below.

When the composition of the present invention is present in an HIL, preferably the HIL layer will be formed by a solution process. A subsequent layer may be applied to the HIL; the subsequent layer is typically an HTL. The HTL may be applied, for example, by an evaporation process (usually used when the HTL consists of small molecules and does not contain polymer) or a solution process (usually used when the HTL contains one or more polymer). If the HTL is applied by a solution process, preferably the HIL is resistant to the solvents used in the solution process for applying the HTL.

When the composition of the present invention is present in an HTL, preferably the HTL layer will be formed by a solution process. A subsequent layer may be applied to the HTL; the subsequent layer is typically an emitting layer. If the subsequent layer is applied by a solution process, preferably the HTL is resistant to dissolution in the solvent used in the solution process for applying the subsequent layer.

When the composition of the present invention is present in an HITL, it is contemplated that the HITL is in contact with an optional additional hole injection layer or the anode on one side and the emitting layer or an optional electron blocking layer on the other side. When an HITL is used, any additional HIL or HTL is not necessarily present in the QLED.

When a layer containing the polymer of the present invention is applied to a substrate using a solution process, it is preferred that the solution process be performed as follows. Preferably, a solution is formed that contains a polymer of the present invention dissolved in a solvent. Preferably, then a layer of the solution is applied to a substrate (the substrate is preferably either the anode or a previous layer of a QLED), and the solvent is evaporated or allowed to evaporate to make a thin film. It is preferred that the thin film is then heated to a temperature of 170° C. or above, more preferably 180° C. or above; more preferably 200° C. or above.

Preferably, the duration of the exposure to hot atmosphere is 2 minutes or more; more preferably 5 minutes or more. Preferably the atmosphere is inert; more preferably the atmosphere contains 1% or less by weight oxygen gas; more preferably the atmosphere contains 99% or more nitrogen by weight.
EXAMPLES
Preparative Example 1: Summary of Synthesis of Monomer S101
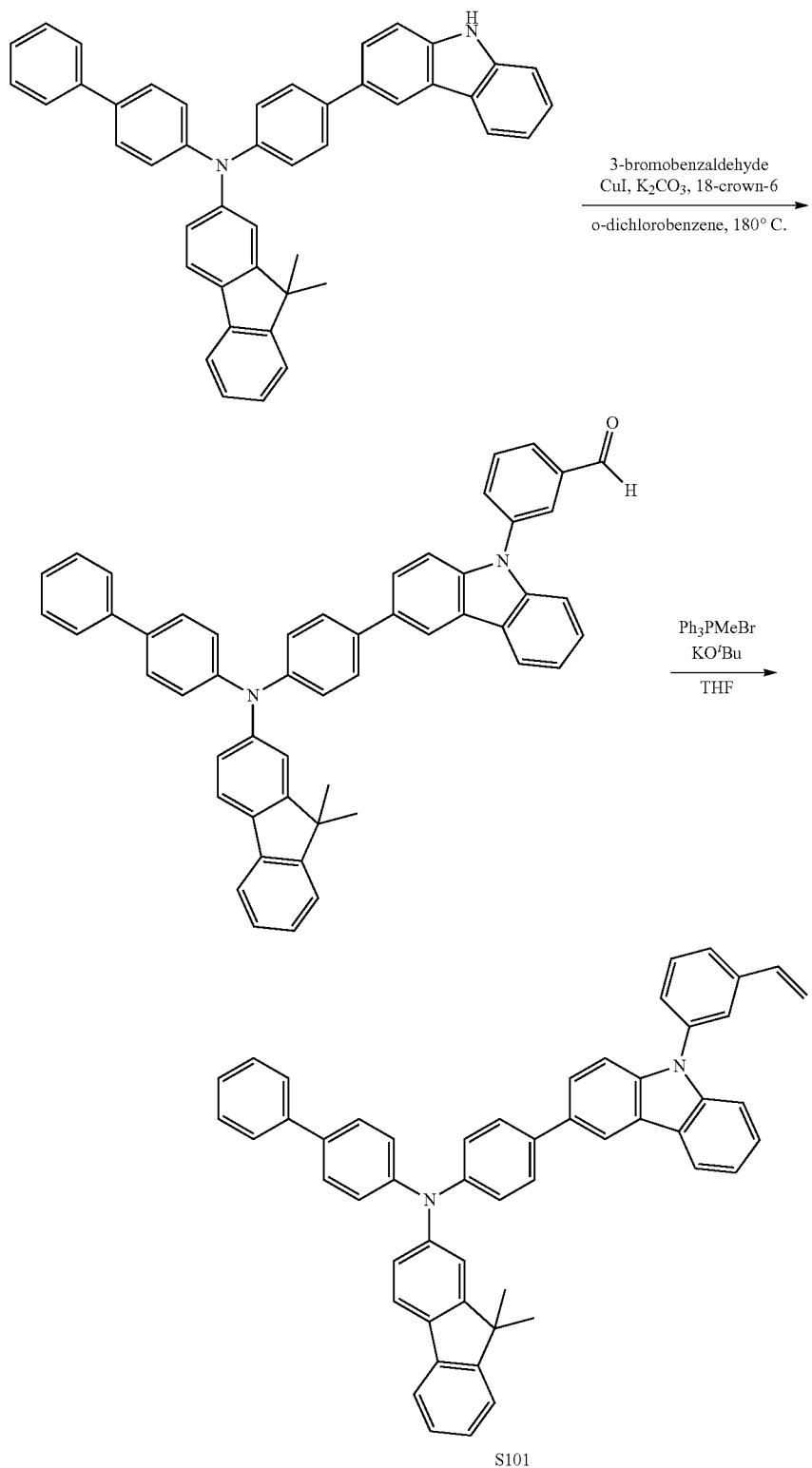
S101

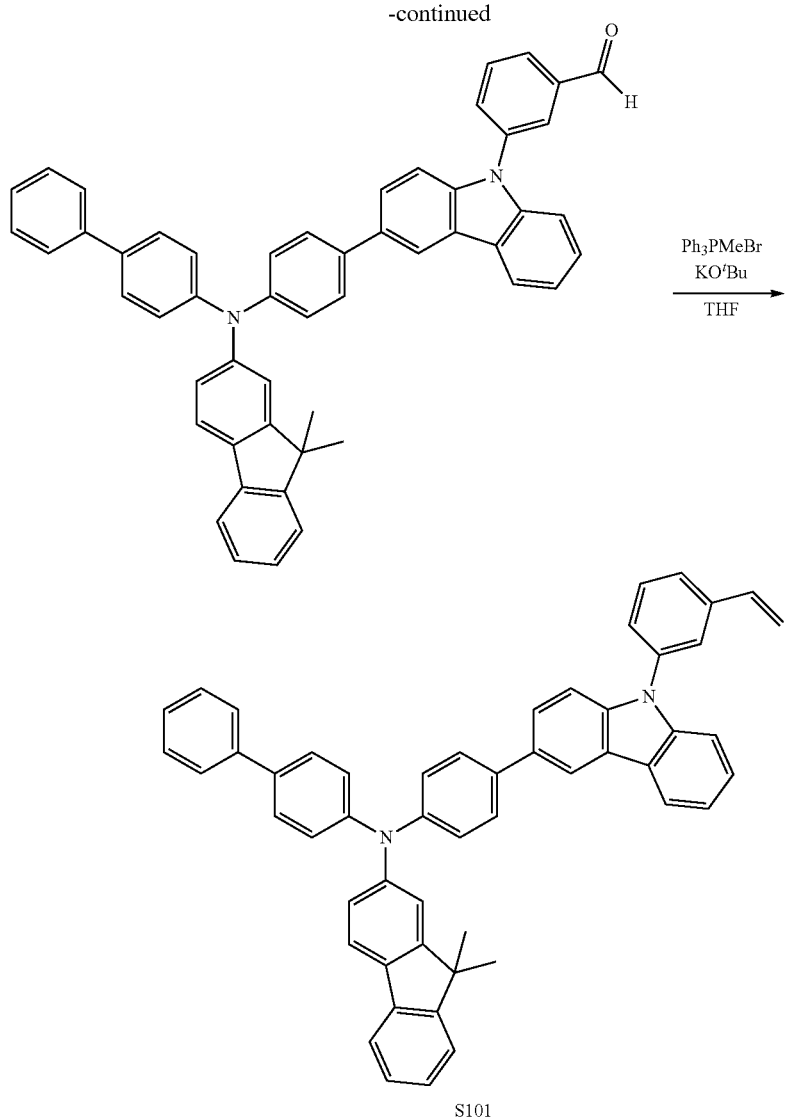

S101

Preparative Example 2: Synthesis of 3-(3-(4-([1,1'-biphenyl]-4-yl(9,9-dimethyl-9H-fluoren-2-yl)amino)phenyl)-9H-carbazol-9-yl)benzaldehyde A round bottom flask was charged with carbazole (9.10 g, 15.1 mmol, 1.0 equiv), 3-bromobenzaldehyde (2.11 mL, 18.1 mmol, 1.2 equiv), CuI (0.575 g, 3.02 mmol, 0.2 equiv), potassium carbonate (6.26 g, 45.3 mmol, 3.0 equiv), and 18-crown-6 (399 mg, 10 mol %). The flask was flushed with nitrogen and connected to a reflux condenser. 55 mL of dry, degassed, 1,2-dichlorobenzene was added, and the mixture was heated to 180° C. overnight. Only partial conversion was noted after 14 hours. An additional 2.1 mL of 3-bromobenzaldehyde was added, and heated continuously for another 24 hours.

The solution was cooled and filtered to remove solids. The filtrate was concentrated and adsorbed onto silica for purification by chromatography (0 to 60% dichloromethane in hexanes), which delivered product as a pale yellow solid (8.15 g, 74%). $^1$H NMR (500 MHz, CDCl$_3$) δ 10.13 (s, 1H), 8.39-8.32 (m, 1H), 8.20 (dd, J=7.8, 1.0 Hz, 1H), 8.13 (t, J=1.9 Hz, 1H), 7.99 (d, J=7.5 Hz, 1H), 7.91-7.86 (m, 1H), 7.80 (t, J=7.7 Hz, 1H), 7.70-7.58 (m, 7H), 7.56-7.50 (m, 2H), 7.47-7.37 (m, 6H), 7.36-7.22 (m, 9H), 7.14 (ddd, J=8.2, 2.1, 0.7 Hz, 1H), 1.46 (s, 6H). $^{13}$C NMR (126 MHz, CDCl$_3$) δ 191.24, 155.15, 153.57, 147.22, 146.99, 146.60, 140.93, 140.60, 139.75, 138.93, 138.84, 138.17, 136.07, 135.13, 134.42, 133.53, 132.74, 130.75, 128.75, 128.49, 127.97, 127.79, 127.58, 126.97, 126.82, 126.64, 126.51, 126.36, 125.36, 124.47, 124.20, 123.94, 123.77, 123.60, 122.47, 120.68, 120.60, 120.54, 119.45, 118.88, 118.48, 109.71, 109.58, 46.88, 27.12.

Preparative Example 3: Synthesis of N-([1,1'-biphenyl]-4-yl)-9,9-dimethyl-N-(4-(9-(3-vinylphenyl)-9H-carbazol-3-yl)phenyl)-9H-fluoren-2-amine (S101)

Under a blanket of nitrogen, a round bottom flask was charged with methyltriphenylphosphonium bromide (14.14 g, 39.58 mmol, 2.00 equiv) and 80 mL dry THF. Potassium tert-butoxide (5.55 g, 49.48 mmol, 2.50 equiv) was added in once portion, and the mixture stirred for 15 minutes. Aldehyde from Preparative Example 2 (13.99 g, 19.79 mmol, 1.00 equiv) was added in 8 mL dry THF. The slurry stirred at room temperature overnight. The solution was diluted with dichloromethane, and filtered through a plug of silica. The pad was rinsed with several portions of dichloromethane.

The filtrate was adsorbed onto silica and purified by chromatography twice (10 to 30% dichloromethane in hexanes), which delivered product as a white solid (9.66 g, 67%) Purity was raised to 99.7% by reverse phase chromatography. $^1$H NMR (400 MHz, CDCl$_3$) δ 8.35 (d, J=1.7 Hz, 1H), 8.18 (dt, J=7.7, 1.0 Hz, 1H), 7.68-7.39 (m, 19H), 7.34-7.23 (m, 9H), 7.14 (dd, J=8.1, 2.1 Hz, 1H), 6.79 (dd, J=17.6, 10.9 Hz, 1H), 5.82 (d, J=17.6 Hz, 1H), 5.34 (d, J=10.8 Hz, 1H), 1.45 (s, 6H). $^{13}$C NMR (101 MHz, CDCl$_3$) δ 155.13, 153.57, 147.26, 147.03, 146.44, 141.29, 140.61, 140.13, 139.55, 138.95, 137.99, 136.36, 135.98, 135.06, 134.36, 132.96, 130.03, 128.74, 127.97, 127.77, 126.96, 126.79, 126.63, 126.49, 126.31, 126.11, 125.34, 125.16, 124.67, 124.54, 123.90, 123.55, 123.49, 122.46, 120.67, 120.36, 120.06, 119.44, 118.83, 118.33, 115.27, 110.01, 109.90, 46.87, 27.12.

Preparative Example 4: Protocol for Radical Polymerization

In a glovebox, S101 monomer (1.00 equiv) was dissolved in anisole (electronic grade, 0.25 M). The mixture was heated to 70° C., and AIBN solution (0.20 M in toluene, 5 mol %) was injected. The mixture was stirred until complete consumption of monomer, at least 24 hours (2.5 mol % portions of AIBN solution can be added to complete conversion). The polymer was precipitated with methanol (10× volume of anisole) and isolated by filtration. The filtered solid was rinsed with additional portions of methanol. The filtered solid was re-dissolved in anisole and the precipitation/filtration sequence repeated twice more. The isolated solid was placed in a vacuum oven overnight at 50° C. to remove residual solvent.

Preparative Example 5: Measurement of Molecular Weight of Polymer

Gel permeation chromatography (GPC) studies were carried out as follows. 2 mg of HTL polymer was dissolved in 1 mL THF. The solution was filtered through a 0.2 m polytetrafluoroethylene (PTFE) syringe filter and 50 µl of the filtrate was injected onto the GPC system. The following analysis conditions were used: Pump: Waters™ e2695 Separations Modules at a nominal flow rate of 1.0 mL/min; Eluent: Fisher Scientific HPLC grade THF (stabilized); Injector: Waters e2695 Separations Modules; Columns: two 5 µm mixed-C columns from Polymer Laboratories Inc., held at 40° C.; Detector: Shodex RI-201 Differential Refractive Index (DRI) Detector; Calibration: 17 polystyrene standard materials from Polymer Laboratories Inc., fit to a 3rd order polynomial curve over the range of 3,742 kg/mol to 0.58 kg/mol.

| Monomer | $M_n$ | $M_w$ | $M_z$ | $M_{z+1}$ | $M_w/M_n$ |
|---|---|---|---|---|---|
| S101 | 23,413 Da | 88,953 Da | 176,978 Da | 266,718 Da | 3.799 |

Example 6: Oxidation of Polymer

In a glovebox, the HTL polymer as made in Preparative Example 4 was dissolved in anisole (14 mL/g polymer), and oxidizing agent (Ag(I) tetra(pentafluorophenyl)borate, as described in Inorg. Chem. 2012, 51, 2737-2746) was added in a single portion. After stirring for 24 hours at ambient temperature (approximately 23° C., the solution was filtered through a 0.2 µm syringe filter. The material may be used in solution, or the polymer may be precipitated by addition of an excess of methanol. Various polymers were made using various amounts of oxidizing agent, as follows:

| Polymer Designation | Equivalents of oxidizing agent per equivalent of monomer |
|---|---|
| p(S101)-00 | comparative polymer made in Preparative Example 4 |
| P(S101)-02 | 0.02 |
| P(S101)-05 | 0.05 |
| P(S101)-10 | 0.10 |

An alternative method that could be used for oxidizing the polymer is as follows. In a glovebox, a round bottom flask could be charged with the HTL polymer and dichloromethane (50 mL per gram polymer). An equivalent amount of acetonitrile would be added slowly, making sure that precipitation of the substrate did not occur. NOBF$_4$ (0.0642 M in acetonitrile, 0.1 equiv) would be added dropwise, which would turn the solution deep green. The mixture would be allowed to stir open to the ambient glovebox atmosphere for 30 minutes. Solvent would be removed by vacuum pump.

Preparative Example 7: Experimental Procedures

Preparation of HTL solution formulation: HTL polymer solid powders were directly dissolved into anisole to make a 2 wt % stock solution. The solution was stirred at 80° C. for 5 to 10 min in N$_2$ for complete dissolution. The resulting formulation solution was filtered through 0.2 µm PTFE syringe filter prior to depositing onto Si wafer.

Preparation of polymer film: Si wafer was pre-treated by UV-ozone for 2 to 4 min prior to use. Several drops of the above filtered formulation solution were deposited onto the pre-treated Si wafer. The thin film was obtained by spin coating at 500 rpm for 5 s and then 2000 rpm for 30 s. The resulting film was then transferred into the N$_2$ purging box. The "wet" film was prebaked at 100° C. for 1 min to remove most of residual anisole. Subsequently, the film was thermally cross-linked at temperature between 160° C. and 220° C. for a time between 10 and 30 min (details below).

Strip test on thermally annealed polymer film was performed as follows. The "Initial" thickness of thermally cross-linked HTL film was measured using an M-2000D ellipsometer (J. A. Woollam Co., Inc.). Then, several drops of o-xylene or anisole were added onto the film to form a puddle. After 90 s, the solvent was spun off at 3500 rpm for 30 s. The "Strip" thickness of the film was immediately measured using the ellipsometer. The film was then transferred into the N$_2$ purging box, followed by post-baking at 100° C. for 1 min to remove any swollen solvent in the film. The "Final" thickness was measured using the ellipsometer. The film thickness was determined using the Cauchy relationship and averaged over 3×3=9 points in a 1 cm×1 cm area. For a fully solvent resistant film, the total film loss ("Final"−"Initial") after strip test should be <1 nm, preferably <0.5 nm.

Example 8: Strip Test Using o-Xylene

Films were made and stripped as described above. Films were annealed for 20 minutes at 150° C. and 180° C. or for 10 minutes at 205° C. and 220° C. Results were as follows:

| o-xylene Film Loss | | | | |
|---|---|---|---|---|
| | Annealing Times and Temperature | | | |
| Polymer | 20 min 150° C. | 20 min 180° C. | 10 min 205° C. | 10 min 220° C. |
| p(S101)-00 (comparative) | 13 nm | 0 | 0 | 0 |
| p(S101)-10 | 19 nm | 0 | 0 | 0 |

Annealing at temperature above 150° C. improves the polymer's resistance to stripping by o-xylene. The inventive polymer p(S101)-10 is resistant to stripping by o-xylene when annealed at 180° C. and above.

Preparative Example 9: Synthesis of S102 and S103

Using methods similar to Preparative Examples 1-4, the following monomers were synthesized:

(S102)

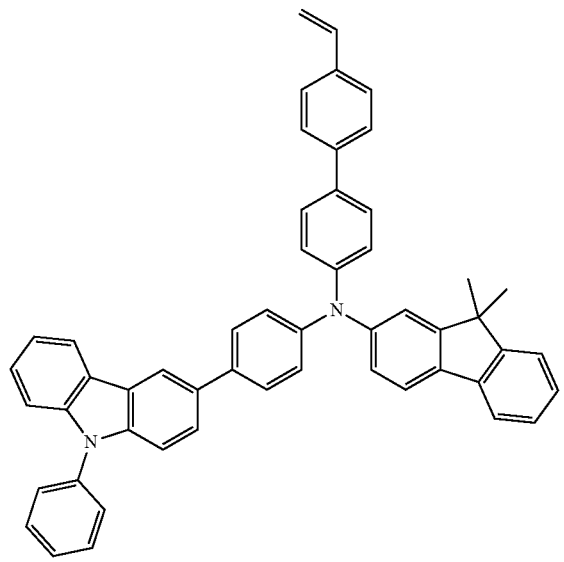

(S103)

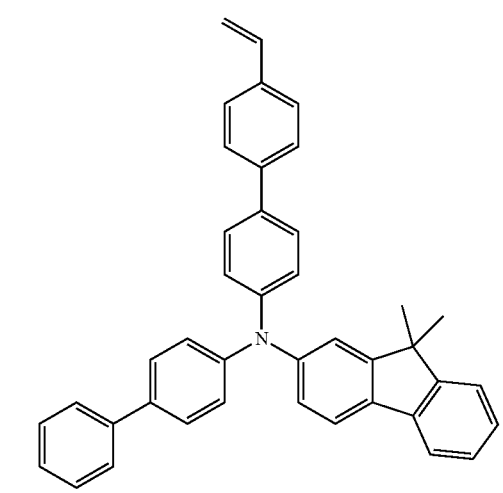

Following the procedure in Preparative Example 4, homopolymers p(S102) and p(S103) were formed. Following the procedures in Preparative Example 6, using 0.10 equivalents of oxidizing agent, partially oxidized polymers having aminium radical cations p(S102)-10 and p(S103)-10 were formed. The oxidizing agent was (Ag(I) tetra(pentafluorophenyl)borate.

Example 10: Calculation of Orbital Energies

Orbital energies were calculated as follows. The ground-state ($S_0$) configurations of the molecules were computed using Density Functional Theory (DFT) with hybrid functional (B3LYP) and 6-31 g* basis set. For these closed shell systems (i.e., neutral molecules) the calculations were performed using the restricted approach, whereas for radical cations (open shell system containing an unpaired electron), the calculations were performed using the unrestricted approach. The energies of HOMO (highest occupied molecular orbital), SUMO (singly unoccupied molecular orbital for the radical cation) and LUMO (next unoccupied molecular orbital for the radical cation) were obtained from the ground-state geometries of the neutral molecule and the radical cation. Vibrational analysis on these geometries was performed and the lack of imaginary frequencies helped to ascertain the minima on the potential energy surface (PES). All calculations were performed using G09 suite of programs, as described in Frisch, M. J. T., G. W.; Schlegel, H. B.; Scuseria, G. E.; Robb, M. A.; Cheeseman, J. R.; Montgomery, Jr., J. A.; Vreven, T.; Kudin, K. N.; Burant, J. C.; Millam, J. M.; Iyengar, S. S.; Tomasi, J.; Barone, V.; Mennucci, B.; Cossi, M.; Scalmani, G.; Rega, N.; Petersson, G. A.; Nakatsuji, H.; Hada, M.; Ehara, M.; Toyota, K.; Fukuda, R.; Hasegawa, J.; Ishida, M.; Nakajima, T.; Honda, Y.; Kitao, O.; Nakai, H.; Klene, M.; Li, X.; Knox, J. E.; Hratchian, H. P.; Cross, J. B.; Bakken, V.; Adamo, C.; Jaramillo, J.; Gomperts, R.; Stratmann, R. E.; Yazyev, O.; Austin, A. J.; Cammi, R.; Pomelli, C.; Ochterski, J. W.; Ayala, P. Y.; Morokuma, K.; Voth, G. A.; Salvador, P.; Dannenberg, J. J.; Zakrzewski, V. G.; Dapprich, S.; Daniels, A. D.; Strain, M. C.; Farkas, O.; Malick, D. K.; Rabuck, A. D.; Raghavachari, K.; Foresman, J. B.; Ortiz, J. V.; Cui, Q.; Baboul, A. G.; Clifford, S.; Cioslowski, J.; Stefanov, B. B.; Liu, G.; Liashenko, A.; Piskorz, P.; Komaromi, I.; Martin, R. L.; Fox, D. J.; Keith, T.; Al-Laham, M. A.; Peng, C. Y.; Nanayakkara, A.; Challacombe, M.; Gill, P. M. W.; Johnson, B.; Chen, W.; Wong, M. W.; Gonzalez, C.; and Pople, J. A; A.02 ed.; Gaussian Inc.: Wallingford Conn., 2009.

Orbital Energies for S103

| Molecule[2] | Form | Solvent | Orbital | Energy (eV) |
|---|---|---|---|---|
| S103 | neutral | anisole | HOMO | −4.9 |
| S103 | neutral | toluene | HOMO | −4.9 |
| S103 | neutral | Anisole | LUMO | −1.0 |
| S103 | neutral | Toluene | LUMO | −1.0 |
| S103 | neutral | Anisole | triplet | 2.6 |
| S103 | neutral | Toluene | triplet | 2.6 |
| S103 | radical cation | anisole | SUMO | −5.1 |
| S103 | radical cation | toluene | SUMO | −5.51 |
| S103 | radical cation borate | anisole | SUMO | −4.7 |
| S103 | radical cation borate | toluene | SUMO | −4.9 |
| S103 | radical cation | anisole | LUMO | −2.3 |
| S103 | radical cation | toluene | LUMO | −2.7 |
| S103 | radical cation borate | anisole | LUMO | −1.9 |
| S103 | radical cation borate | toluene | LUMO | −2.1 |

[2]Orbital energies were computed for the core structure of S103 without the vinyl group.

In both S101 and S103, the SUMO orbital energy of the radical cation is similar to the HOMO orbital energy of the neutral molecule. It is contemplated that this result means that when radical cations are mixed with neutral molecules, the radical cations will be able to act as a p-dopants, thus allowing the mixture to function as an HIL and/or as an HTL. The orbital energies shown in the table above can be used to design device architecture, including the use of specific materials for HIL, HTL, and EBL.

QLED Device Fabrication

QLED devices were constructed as follows. Glass substrates (20 mm×15 mm) with pixelated tin-doped indium oxide (ITO) electrodes (Ossila Inc.) were used. The ITO was treated using oxygen plasma. The hole-injection layer (HIL) was Plexcore™ OC RG-1200 (Poly(thiophene-3-[2-(2-methoxyethoxy)ethoxy]-2,5-diyl) available from Sigma-Aldrich. The HIL solution was filtered with 0.45 micron polyvinylidene fluoride (PVDF) syringe filter and deposited into a layer by dynamic spin coating whereby 20 μL of the solution was dispensed onto a spinning substrate. The spin speed was approximately 2000 RPM to achieve a film thickness of approximately 40 nm. Some portions of the deposited film, which covered sections of the electrodes, were removed with toluene using a foam swab. The devices were then annealed at 150° C. for 30 minutes on a hot plate in an inert atmosphere.

To form the hole transport layer (HTL), each HTL polymer was individually dissolved in electronic grade anisole (2% w/w) at elevated temperature (<100° C.) to ensure complete dissolution and passed through a 0.2 m polytetrafluoroethylene (PTFE) filter. The materials were deposited into a layer by dynamic spin coating whereby 20 μL of the solution was dispensed onto a spinning substrate. The spin speed (approximately 2000 RPM) was adjusted for each material to achieve a film thickness of approximately 40 nm. Some portions of the deposited film, which covered sections of the electrodes, were removed with toluene using a foam swab. The devices were then annealed at 205° C. for 10 minutes on a hot plate in an inert atmosphere. A well-studied literature HTL consisting of a 50:50 mixture of poly[(9,9-dioctylfluorenyl-2,7-diyl)-co-(4,40-(N-(4-sec-butylphenyl))diphenylamine)] (TFB) and 2,3,5,6-tetrafluoro-7,7,8,8-tetracyanoquinodimethane (F4TCNQ) was used as a reference.

The light emitting material was selected from the list below. Each material was deposited into a layer by dynamic spin coating whereby 20 μL of the solution was dispensed onto a spinning substrate. The spin speed (approximately 2000 to 4000 RPM) was adjusted for each material to achieve a film thickness of approximately 5-15 nm. Some portions of the deposited film, which covered sections of the electrodes, were removed with toluene using a foam swab. The devices were then annealed at 180° C. for 10 minutes on a hot plate in an inert atmosphere.

Light emitting layer materials used were as follows:
1) CdSe/ZnS (520 nm emission);
2) InP/ZnS (620 nm emission); and
3) CdS/CdSe/ZnSe DHNR (600 nm emission).

The CdSe/ZnS and InP/ZnS were purchased from Aldrich as catalog numbers 748021 and 776777, respectively. The quantum dots were dispersed in toluene at a concentration of ~20 mg/ml, and used as is.

The DHNR was Synthesized According to the Following Procedure.

Technical grade trioctylphosphine oxide (90%), technical grade trioctylphosphine (TOP) (90%), technical grade oleic acid (90%), technical grade octadecene (90%), CdO (99.5%), Zn acetate (99.99%), S powder (99.998%) and Se powder (99.99%) were obtained from Sigma Aldrich. N-octadecyl phosphonic acid (ODPA) was obtained from PCI Synthesis. ACS grade chloroform and methanol were obtained from Fischer Scientific. All chemicals were used as received.

Synthesis of CdS Nanorods:

CdS nanorods were prepared in a manner similar to established methods14. The reactions were carried out in a standard Schlenk line under $N_2$ atmosphere. First, 2.0 g (5.2 mmol) of trioctylphosphine oxide, 0.67 g (2.0 mmol) of ODPA and 0.13 g (2.0 mmol) of CdO in a 50-ml three-neck round-bottom flask were degassed at 150° C. for 30 min under vacuum, and then heated to 350° C. with stirring. As the Cd-ODPA complex was formed at 350° C., the brown solution in the flask became optically transparent and colourless typically after 1 h. The solution was then cooled and degassed at 150° C. for 10 min to remove byproducts of complexation including $O_2$ and $H_2O$. After degassing, the solution was reheated to 350° C. under $N_2$ atmosphere. S precursor containing 16 mg (0.5 mmol) of S dissolved in 1.5 ml of TOP was swiftly injected into the flask with a syringe. Consequently, the reaction mixture was quenched to 330° C. where the CdS growth was carried out. After 15 min, the CdS nanorods growth was terminated by cooling to 250° C., where the CdSe growth on CdS nanorods was carried out. An aliquot of the CdS nanorods was taken and cleaned by precipitation with methanol and butanol for characterization. The CdS/CdSe heterostructures were formed by adding Se precursor slowly to the same reaction flask, maintained under $N_2$ atmosphere as described below.

Synthesis of CdS/CdSe Nanorod Heterostructures:

The one-pot synthesis of rod-rod-rod shaped nanorod heterostructures were carried out in a similar manner to the established method. Following the formation of CdS nanorods, Se precursors containing 20 mg (0.25 mmol) of Se dissolved in 1.0 ml of TOP was slowly injected at 250° C. at a rate of 4 ml $h^{-1}$ via syringe pump (total injection time ~15 min). The reaction mixture was then allowed to stir for an additional 5 min at 250° C. before being rapidly cooled by an air jet. An aliquot of CdS/CdSe nanorod heterostructures was taken and cleaned by precipitation with methanol and butanol for analysis. The final reaction mixture was dissolved in chloroform, and centrifuged at 2,000 RPM. The precipitate was re-dissolved in chloroform for the next step. This solution of CdS/CdSe nanorod heterostructures had an optical density of 0.75 (in a cuvette with 1 cm optical path length) at the CdS band-edge absorption peak when diluted by a factor of 10.

Synthesis of CdS/CdSe/ZnSe DHNRs:

CdS/CdSe/ZnSe DHNRs were synthesized by growing ZnSe onto CdS/CdSe nanorod heterostructures. For Zn precursor, 6 ml of octadecene, 2 ml of oleic acid and 0.18 g (1.0 mmol) of Zn acetate were degassed at 150° C. for 30 min. The mixture was heated to 250° C. under $N_2$ atmosphere, and consequently Zn oleate was formed after 1 h. 2 ml of previously prepared CdS/CdSe stock solution was injected into Zn oleate solution after cooling to 50° C. Chloroform was allowed to evaporate for 30 min under vacuum at 70° C. ZnSe growth was initiated by a slow injection of the Se precursor containing 39 mg (0.50 mmol) of Se dissolved in 2.0 ml of TOP to the reaction mixture at 250° C. Thickness of ZnSe on CdS/CdSe nanorod heterostructures was controlled by the amount of Se injected. The ZnSe growth was terminated by removing the heating mantle after injecting the desired amount of Se precursor. After washing twice with chloroform and methanol mixture (1:1 volume ratio), CdS/CdSe/ZnSe DHNRs were finally dispersed in toluene at (~30 mg $ml^{-1}$), ZnO Synthesis:

ZnO was used as the electron transport layer (ETL). The ZnO was synthesized according to a published literature procedure. Briefly, a solution of potassium hydroxide (1.48 g) in methanol (65 ml) was added to zinc acetate dihydrate (2.95 g) in methanol (125 ml) solution and the reaction mixture was stirred at 60° C. for 2 h. The mixture was then cooled to room temperature and the precipitate was washed twice with methanol. The precipitate was suspended in 1-butanol to form the final ZnO solution. The ZnO was deposited into a layer by dynamic spin coating whereby 20 μL of the solution was dispensed onto a spinning substrate. The spin speed, approximately 2000 RPM, was adjusted to achieve a film thickness of approximately 30 nm. Some portions of the deposited film, which covered sections of the electrodes, were removed with butanol using a foam swab. The devices were then annealed at 120° C. for 10 minutes on a hot plate in an inert atmosphere.

A 100 nm layer of aluminum was deposited by thermal evaporation under high vacuum from a graphite crucible through a cathode shadow mask.

The QLED devices were tested as follows. Current-Voltage-Light (JVL) data was collected on un-encapsulated devices inside a $N_2$ glovebox using a custom-made test board from Ossila Inc. The board contained two components: 1) X100 Xtralien™ precision testing source, and 2) Smart PV and OLED Board; in combination, these components were used to test QLED devices over a voltage range of −2 V to 7 V at increments of 0.1 V while measuring current and light output. The light output was measured using an eye response photodiode which includes an optical filter that mimics photopic eye sensitivity (Centronic E Series). The devices were placed inside of the testing chamber on the board and covered with the photodiode assembly. Electrical contact was made to the ITO electrodes by a series of spring-actuated gold probes inside of the Smart Board assembly. The photodiode was located at a distance of 3 mm above the ITO substrate. From the JVL data, critical device parameters were determined including the voltage required to reach 1000 cd/m² of brightness, the current efficiency (in cd/A) of the QLED at 1000 cd/m², and the driving voltage required to reach 10 mA/cm² of current in the QLED. A geometric factor was applied to the measured photodiode current to account for distance between the photodiode and the substrate (3 mm) and the relative positioning from each pixel on the substrate.

Results and Analysis

The HTL polymers listed below were fabricated into example quantum dot light emitting diodes. The example diodes performed acceptably in all tests including quantum dots composed of CdSe/ZnS, InP/ZnS, and DHNRs. The example devices were shown to perform acceptably with quantum dot emission ranging from 520, to 600 and to 620 nm, as listed in the tables below. Example devices were shown to perform acceptably with spherical and rod-like quantum dots.

QLED device performance with spherical CdSe/ZnS quantum dots emitting at 520 nm.

| HTL | Maximum Efficiency (Cd/A) | Efficiency @ 50 Cd/m² | Voltage @ 500 Cd/m² (V) | Voltage @ 10 mA (V) |
|---|---|---|---|---|
| p(S103)-00 | 7.03 | 6.91 | 3.1 | 4.0 |
| p(S103)-10 | 6.47 | 4.79 | 2.2 | 2.6 |
| REFERENCE | 1.21 | 0.89 | 3.8 | 4.1 |

QLED device performance with spherical InP/ZnS quantum dots emitting at 620 nm.

| HTL | Maximum Efficiency (Cd/A) | Efficiency @ 50 Cd/m² | Voltage @ 500 Cd/m² (V) | Voltage @ 10 mA (V) |
|---|---|---|---|---|
| P(S103)-00 | 2.13 | 0.75 | 4.6 | 4.7 |
| P(S103)-10 | 4.56 | 3.78 | 2.3 | 3.1 |
| REFERENCE | 0.22 | 0.18 | 4.6 | 4.0 |

QLED device performance with DHNRs emitting at 600 nm.

| HTL | Maximum Efficiency (Cd/A) | Efficiency @ 50 Cd/m² | Voltage @ 500 Cd/m² (V) | Voltage @ 10 mA (V) |
|---|---|---|---|---|
| P(S103)-00 | 2.81 | 0.30 | 4.8 | 4.7 |
| P(S103)-10 | 0.42 | 0.28 | 3.3 | 3.1 |
| REFERENCE | 0.15 | 0.15 | 4.8 | 4.3 |

The invention claimed is:

1. A quantum dot light emitting diode comprising i) an emitting layer of at least one semiconductor nanoparticle made from semiconductor materials selected from the group consisting of Group II-VI compounds, Group II-V compounds, Group III-VI compounds, Group III-V compounds, Group IV-VI compounds, Group I-III-VI compounds, Group II-IV-VI compounds, Group II-IV-V compounds, or any combination thereof; and ii) a polymer for hole injection or hole transport layer, comprising one or more triaryl aminium radical cations having the structure (S1)

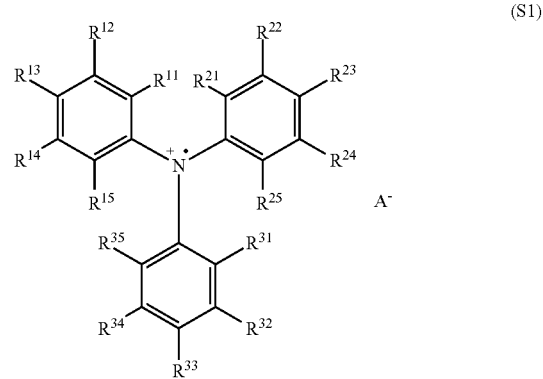

(S1)

and additionally comprising one or more triaryl amine structures (S2)

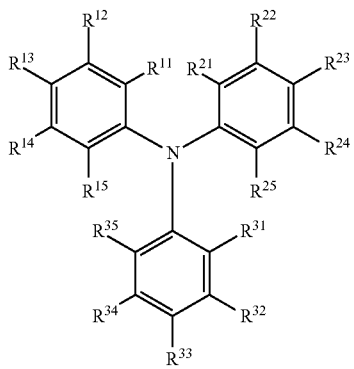

(S2)

wherein each of $R^{11}$, $R^{12}$, $R^{13}$, $R^{14}$, $R^{15}$, $R^{21}$, $R^{22}$, $R^{23}$, $R^{24}$, $R^{25}$, $R^{31}$, $R^{32}$, $R^{33}$, $R^{34}$, and $R^{35}$ is independently selected from the group consisting of hydrogen, deuterium, halogens, amine groups, hydroxyl groups, sulfonate groups, nitro groups, and organic groups, wherein two or more of $R^{11}$, $R^{12}$, $R^{13}$, $R^{14}$, $R^{15}$, $R^{21}$, $R^{22}$, $R^{23}$, $R^{24}$, $R^{25}$, $R^{31}$, $R^{32}$, $R^{33}$, $R^{34}$, and $R^{35}$ are optionally connected to each other to form a ring structure;

wherein one or more of $R^{11}$, $R^{12}$, $R^{13}$, $R^{14}$, $R^{15}$, $R^{21}$, $R^{22}$, $R^{23}$, $R^{24}$, $R^{25}$, $R^{31}$, $R^{32}$, $R^{33}$, $R^{34}$, and $R^{35}$ is covalently bound to the polymer, and wherein $A^-$ is an anion;

and wherein the diode comprises a gradient layer that is located between the anode layer and the emitting layer and that comprises S1 groups and S2 groups, wherein the mole ratio of S2 groups to S1 groups is not uniform throughout the gradient layer.

2. The diode of claim 1, wherein the diode comprises a dual-functional layer that functions as a hole injection layer and a hole transport layer, and wherein the diode does not comprise any additional hole injection layer or hole transport layer, and wherein the dual-functional layer comprises polymer that comprises one or more triaryl aminium radical cations having the structure (S1).

3. The diode of claim 2, wherein the diode additionally comprises one or more electron blocking layers.

4. The diode of claim 1, wherein the polymer is a vinyl polymer or a conjugated polymer.

5. The diode of claim 1, wherein the mole ratio of structures S2 to structures S1 is from 999:1 to 0.001:1.

6. The diode of claim 1, wherein the mole ratio of S2 groups to S1 groups in the portion of the gradient layer nearest the anode layer is defined as MRA:1, wherein the mole ratio of S2 groups to S1 groups in the portion of the gradient layer nearest the emitting layer is defined as MRE:1, and wherein MRA is less than MRE.

7. The diode of claim 6, wherein the ratio of MRA to MRE is 0.9:1 or less.

8. The diode of claim 1, wherein the composition additionally comprises one or more polymers that have no structure S1.

9. The diode of claim 1, wherein the polymer has number average molecular weight of 2,500 to 300,000 Da.

10. The diode of claim 1, wherein $A^-$ is selected from the group consisting of $BF_4^-$, $PF_6^-$, $SbF_6^-$, $AsF_6^-$, $ClO_4^-$, anions of structure SA, anions of structure MA, and mixtures thereof, wherein the structure SA is

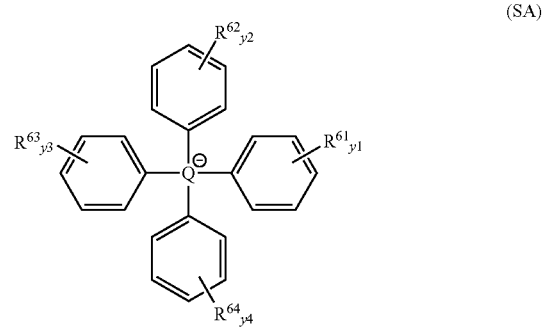

(SA)

wherein Q is B, Al, or Ga, and wherein each of y1, y2, y3, and y4 is independently 0 to 5, and wherein each $R^{61}$ group, each $R^{62}$ group, each $R^{63}$ group, and each $R^{641}$ group is selected independently from the group consisting of deuterium, a halogen, an alkyl, and a halogen-substituted alkyl, and wherein any two groups selected from the $R^{61}$ groups, the $R^{62}$ groups, the $R^{63}$ groups, and the $R^{641}$ groups are optionally bonded together to form a ring structure, and wherein the structure MA is

(MA)

wherein M is B, Al, or Ga, and wherein each of $R^{62}$, $R^{63}$, $R^{64}$, and $R^{65}$ is independently alkyl, aryl, fluoroaryl, or fluoroalkyl.

* * * * *